United States Patent
Inoue et al.

(10) Patent No.: US 8,040,046 B2
(45) Date of Patent: Oct. 18, 2011

(54) ORGANIC ELECTROLUMINESCENT DISPLAY HAVING LIGHT SCATTERING FILM

(75) Inventors: Katsumi Inoue, Minami-Ashigara (JP); Ryuji Saneto, Minami-Ashigara (JP)

(73) Assignee: Fujifilm Corporation, Tokyo (JP)

( * ) Notice: Subject to any disclaimer, the term of this patent is extended or adjusted under 35 U.S.C. 154(b) by 402 days.

(21) Appl. No.: 12/195,041

(22) Filed: Aug. 20, 2008

(65) Prior Publication Data

US 2009/0051276 A1    Feb. 26, 2009

(30) Foreign Application Priority Data

Aug. 21, 2007 (JP) .................. P2007-214895

(51) Int. Cl.
*H01J 1/62* (2006.01)
*H01J 63/04* (2006.01)

(52) U.S. Cl. ........ 313/504; 313/483; 313/498; 313/500; 313/501; 313/506; 313/509; 313/503

(58) Field of Classification Search ................. None
See application file for complete search history.

(56) References Cited

U.S. PATENT DOCUMENTS 7,245,074 B2 * 7/2007 Shiang .................. 313/504
2006/0082285 A1 * 4/2006 Wu et al. .................. 313/503
2007/0108900 A1 * 5/2007 Boek et al. .................. 313/506
2009/0051277 A1 * 2/2009 Inoue et al. .................. 313/504

FOREIGN PATENT DOCUMENTS

| JP | 11-329742 A | 11/1999 |
| JP | 2002-270365 A | 9/2002 |
| JP | 2003-173877 A | 6/2003 |

OTHER PUBLICATIONS

English machine translation of JP 11-329742 (Hosokawa et al).*

* cited by examiner

*Primary Examiner* — Natalie K Walford
(74) *Attorney, Agent, or Firm* — Birch, Stewart, Koalsch & Birch, LLP

(57) ABSTRACT

An organic electroluminescent display includes a pair of substrates; an organic electroluminescent device between the pair of substrates, including: a pair of electrodes of an anode and a cathode, and a light-emitting layer between the pair of electrodes; and a light scattering film on a substrate on the viewing side of the pair of substrates, including: a transparent substrate film, and a light scattering layer which contains a light transmitting resin and a light scattering particle having a particle size of from 0.3 μm to 1.2 μm, wherein a ratio of (np/nb) is from 0.80 to 0.95 or from 1.05 to 1.35, taking a refractive index of the light scattering particle and the light transmitting resin as np and nb, respectively.

16 Claims, 3 Drawing Sheets

ORGANIC ELECTROLUMINESCENT DISPLAY HAVING LIGHT SCATTERING FILM

BACKGROUND OF THE INVENTION

1. Field of the Invention

The present invention relates to an organic electroluminescent display.

2. Description of the Related Art

Organic electroluminescent (organic EL) displays are self-emitting type thin displays, and have advantages of display performance such that high in visibility, and small in viewing angle dependency, as compared with liquid crystal displays. Further, in addition to the advantages of capable of making weight light and thinning, they have the possibility of realizing new shapes of displays that have been unrealized hitherto by using flexible substrates.

Organic EL displays have excellent characteristics as described above. However, although organic EL displays are excellent in viewing angle dependency as compared with liquid crystal displays, the refractive index of each layer including a light-emitting layer constituting the displays is generally higher than the refractive index of air, and since the refractive indexes are different, emission spectrums are different due to the angles to the displays by a light interference effect. This causes a tin variation depending on the viewing angle of the viewer, and may influence viewing angle characteristics.

Further, for the purpose of the improvement of frontal luminance, the use of a photo-resonance effect by the reflection on the surface between the electrodes positioned on both sides of the light-emitting layer, or the use of a prism sheet or the like is exemplified. In that case, the influence of viewing angle dependency is conspicuous.

As a means for improving viewing angle dependency, a method of using light scattering means is disclosed. For examples an organic EL display whose viewing angle characteristic is improved by providing a color filter and a light scattering means on the side for collecting light of the organic EL device is disclosed (e.g., refer to JP-A-11-329742 (The term "JP-A" as used herein refers to an "unexamined published Japanese patent application".)). Specifically, as the scattering means, dispersing inorganic fine particles in the color filter, or providing a light scattering layer wherein inorganic fine particles are dispersed in contiguous to the color filter is disclosed.

Further, an organic EL display provided with a light scattering layer containing light scattering particles on the side to collect lights from the light-emitting layer to improve a viewing angle dependency is disclosed (e.g., refer to JP-A-2002-270365).

Further, for the improvement of viewing angle characteristics, it is proposed to provide a diffusing layer having haze of 80% or more (e.g., refer to JP-A-2003-173877). Specifically, a method of forming a scattering layer on a fluorescent layer by spin coating is shown. However, a light scattering property of the light scattering layer that is preferred for the improvement of viewing angle characteristics is not always sufficient by merely controlling haze.

SUMMARY OF THE INVENTION

In JP-A-11-329742, JP-A-2002-27036S, and JP-A-2003-173877, the light scattering layer is formed directly on the color filter, the fluorescent layer and the like. This is certainly preferred in the viewpoint of the improvement of a blur of letters, but not preferred in the points of manufacturing costs, the thickness of the light scattering layer, and selectivity of the particle size of light scattering particles, and also in the organic electroluminescent device liable to be deteriorated by the influences of moisture content, organic solvents and ultraviolet rays, it is not preferred in the points of manufacturing suitability, durability, selectivity of the kind of light transmitting resin of the fight scattering layer. It is rather preferred to use a light scattering film having provided on a transparent support a light scattering layer having desired light scattering characteristics on the surface of a display.

The representative construction of an organic EL device is shown in FIG. 1. As shown in FIG. 1, an organic EL display fundamentally has the construction comprising lamination of TFT substrate 1, rear electrode 2, organic layer 3 consisting of two or three layers including a light-emitting layer, transparent or translucent electrode 4, and transparent substrate 5. Positive holes injected from rear electrode 2 and electrons injected from translucent electrode 4 are recombined in organic layer 3 to excite a fluorescent substance and emit lights The light emitted from organic layer 3 outgoes from transparent substrate 5 directly or by reflection on rear electrode 2 formed of aluminum or the like. In the construction, the lights reflected on the surface on the side of each light-emitting layer of rear electrode 2 and transparent or translucent electrode 4 are optically resonated, by which the coupling out efficiency of lights is bettered and surface luminance can be improved. However, there arises a problem that the directivity of light becomes stronger and viewing angle dependency of tint becomes conspicuous, so that the improvement is desired.

An aspect of the invention is to provide an organic EL display improved in viewing angle dependency. Another aspect is to provide an organic EL display restrained in a blur of letters, that can be easily manufactured, and having high productivity and high durability. These aspects of the invention can be achieved by the following organic electroluminescent display.

(1) An organic electroluminescent display comprising:
  a pair of substrates;
  an organic electroluminescent device between the pair of substrates, comprising:
    a pair of electrodes of an anode and a cathode, and
    a light-emitting layer between the pair of electrodes; and
  a light scattering film on a substrate on the viewing side of the pair of substrates, comprising:
    a transparent substrate film, and
    a light scattering layer which contains a light transmitting resin and a light scattering particle having a particle size of from 0.3 μm to 1.2 μm,
  wherein
  a ratio of (np/nb) is from 0.80 to 0.95 or from 1.05 to 1.35, taking a refractive index of the light scattering particle and the light transmitting resin as np and nb, respectively.

(2) The organic electroluminescent display of (1), wherein the particle size of the light scattering particles is from 0.4 μm to 1.0 μm.

(3) The organic electroluminescent display of (1), wherein the light scattering film has asymmetry (g) of from 0.70 to 0.98.

(4) The organic electroluminescent display of (1), wherein the light scattering film has a scattering efficiency (e) of from 0.05 to 12.0.

(5) The organic electroluminescent display of (1), wherein a ratio of ($I_{30}/I_0$) is from 0.08 to 0.99, taking a scattered light intensity of a scattered light profile by a gonio-photometer at output angle 0° and 30° as $I_0$ and $I_{30}$, respectively.

(6) The organic electroluminescent display of (1), wherein
the light scattering film is an antireflection film comprising a low refractive index layer, directly or via any other layer, on a surface of the light scattering layer, and
an average value of mirror reflectivity at 5° incidence of the antireflection film in a wavelength region of from 450 to 650 nm is from 0.1% to 2.0%

(7) The organic electroluminescent display of (6), wherein
the tints of regularly reflected light of the antireflection film to 5° incident light of CIE standard light source D65 in a wavelength region of from 380 nm to 780 nm as a* and b* values of CIE1976L*a*b* color space are respectively in a range of $-8 \leq a^* \leq 8$ and $-10 \leq b^* < 10$.

(8) The organic electroluminescent display of (1), wherein
a center line average roughness (Ra) on a surface of the light scattering film is from 0.003 μm to 0.20 μm.

(9) The organic electroluminescent display of (1), wherein
the transparent substrate film has a thickness of from 10 μm to 80 μm.

(10) The organic electroluminescent display of (1) wherein
the transparent substrate film has a water vapor permeability of 0.01 g/m²·day or less at 40° C. 90% RH.

(11) The organic electroluminescent display of (1), wherein
a maximum value of emission wavelength is from 350 nm to 700 nm, and
$[(x_{60}-x_0)^2+(y_{60}-y_0)^2]^{1/2}$ is from 0.05 to 0.3, taking a color coordinate of emission spectrum in a direction of output angle of 0° and 60° on xy chromaticity diagram as $(x_0, y_0)$ and $(x_{60}, y_{60})$, respectively.

(12) The organic electroluminescent display of (1), wherein
a light reflected between the surfaces of both electrodes is optically resonated.

(13) The organic electroluminescent display of (1), wherein
the substrate on the viewing side has a thickness of from 0.01 mm to 0.70 mm.

(14) The organic electroluminescent display of (1), wherein
the substrate on the viewing side has a thickness of from 0.03 mm to 0.30 mm.

(15) The organic electroluminescent display of (1) wherein
at least one of the surface and the edge of the substrate on the viewing side is coated with a polymer.

(16) The organic electroluminescent display of (1), wherein
the substrate on the viewing side is a gas barrier film,

(17) An organic electroluminescent display comprising:
a pair of substrates; and
an organic electroluminescent device between the pair of substrates, comprising:
a pair of electrodes of an anode and a cathode, and
a light-emitting layer between the pair of electrodes
wherein
at least a substrate on the viewing side of the pair of substrates is a light scattering film comprising.
a gas barrier film having a water vapor permeability of 0.01 g/m²·day or less at 40° C. 90% RH, and
a light scattering layer which contains a light transmitting resin and a light scattering particle having a particle size of from 0.3 μm to 1.2 μm; and
a ratio of (np/nb) is from 0.80 to 0.95 or from 1.05 to 1.35, taking a refractive index of the light scattering particle and the light transmitting resin as np and nb, respectively.

DETAILED DESCRIPTION OF THE INVENTION

The present invention will be described in detail below. The description of "A to B" in the specification of the invention means "A or more and B or less". Further, "organic EL" means "organic electroluminescence".

One embodiment of the organic electroluminescent display in the invention is an organic electroluminescent display having, between a pair of substrates, an organic electroluminescent device of a structure having a pair of electrodes of the anode and the cathode and a light-emitting layer between the pair of electrodes, wherein a substrate on the viewing side of the pair of substrates is a light scattering film having a transparent substrate film and a light scattering layer, the light scattering layer contains a light transmitting resin and light scattering particles, the particle size of the light scattering particles is in the range of 0.3 μm or more and 1.2 μm or less, and the ratio of the refractive index of the list scattering particles (np) to the refractive index of the light transmitting resin (nb) (np/nb) is 0.80 or more and 0.95 or less, or 1.05 or more and 1.35 or less.

Another embodiment of the organic electroluminescent display in the invention is an organic electroluminescent display having, between a pair of substrates, an organic electroluminescent device of a structure having a pair of electrodes of the anode and the cathode and a light-emitting layer between the pair of electrodes, wherein at least a substrate on the viewing side of the substrates is a light scattering film having a gas barrier film and a light scattering layer, the light scattering layer contains a light transmitting resin and light scattering particles, the particle size of the light scattering particles is in the range of 0.3 μm or more and 1.2 μm or less, and the ratio of the refractive index of the light scattering particles (np) to the refractive index of the light transmitting resin (nb) (np/nb) is 0.80 or more and 0.95 or less, or 1.05 or more and 1.35 or less.

The construction of the organic electroluminescent display (organic EL display) in the invention will be described below.

A Light Scattering Film:

A light scattering film comprising a transparent substrate film having formed thereon light scattering layer is used in the invention. The use of the light scattering film is advantageous in that the productivity is high as compared with the case where a light scattering layer is directly provided on a color filter and an EL device, manufacturing costs can be reduced, durability can be heightened, and selectivity of manufacturing process and selectivity of material and film thickness are high. Further, the light scattering layer also has the function of a hard coat layer of the surface at the same time, so that a hard coat layer does not have to be provided separately, and this is an excellent advantage of the invention.

Figure 1:
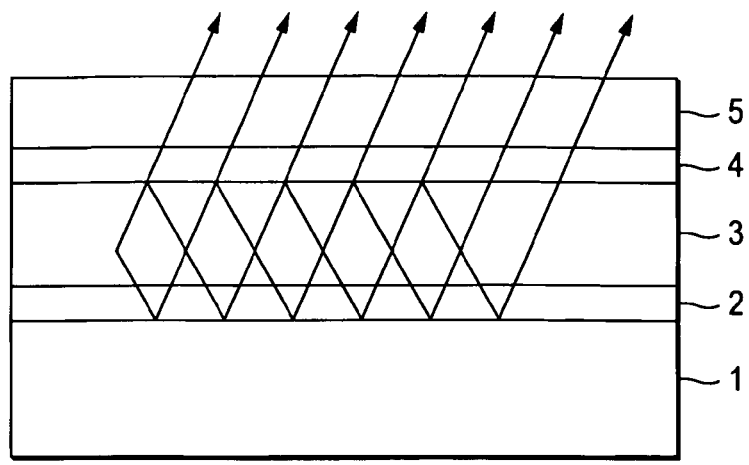
FIG. 1 is a typical view showing an organic EL display using a photo-resonance effect.
Figure 2:
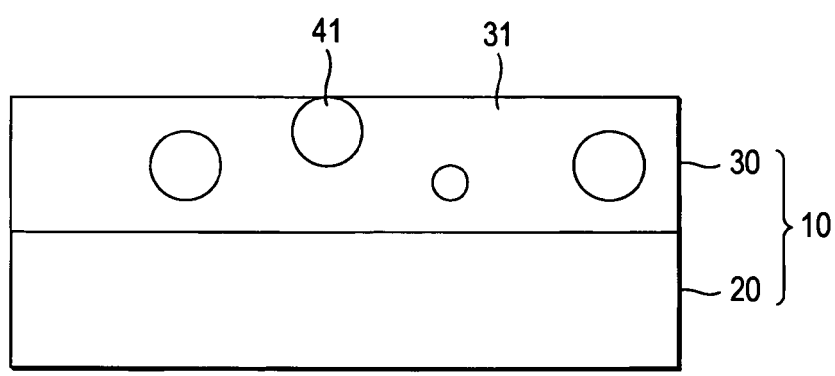
FIG. 2 is a typical view showing an example of a light scattering film containing a transparent substrate film and a light diffusing layer for use in the invention.
Figure 3:
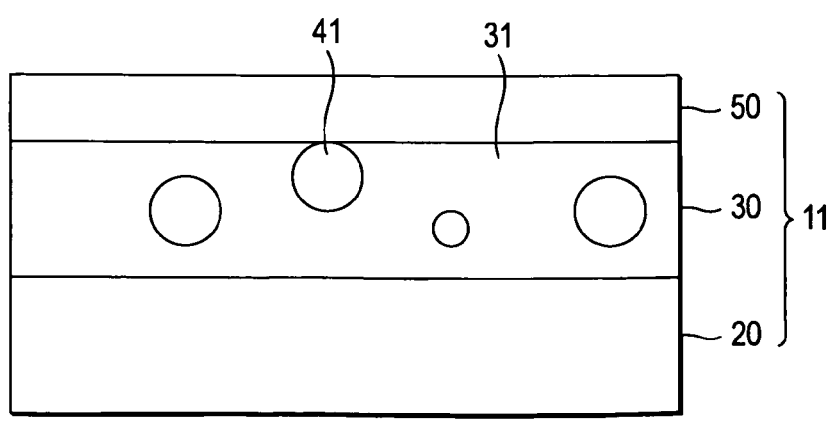
FIG. 3 is a typical view showing an example of an antireflection film containing a transparent substrate film, a light scattering layer and a low refractive index layer for use in the invention.
Figure 4:
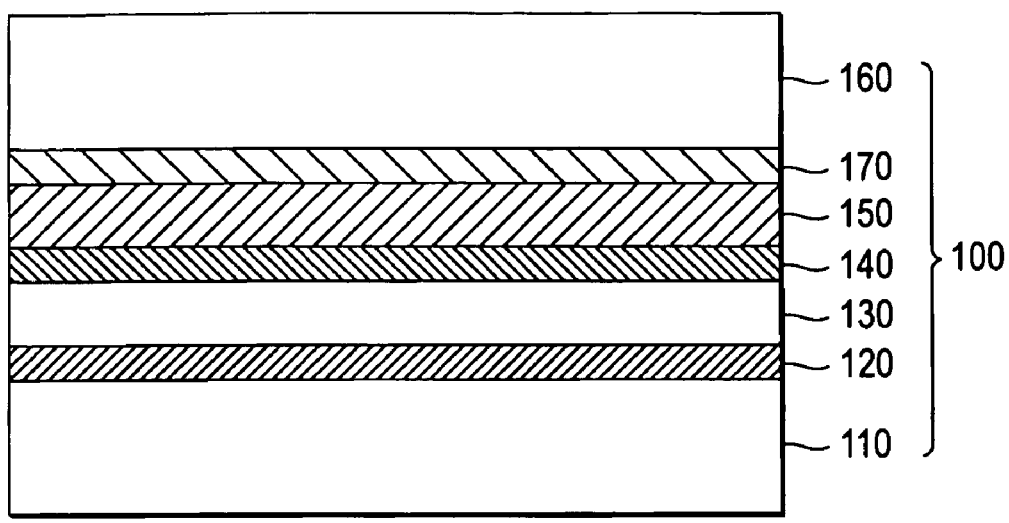
FIG. 4 is a schematic diagram showing a fundamental constitution of an organic EL display.
Figure 5:
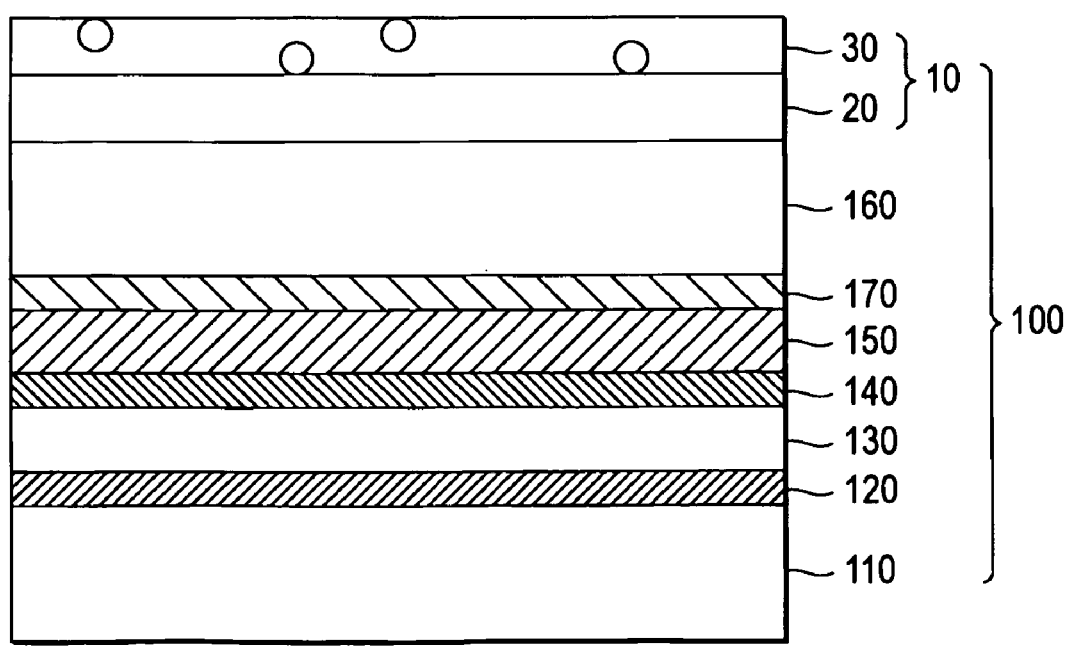
FIG. 5 is a typical view showing the constitution of one embodiment of the invention.
Figure 6:
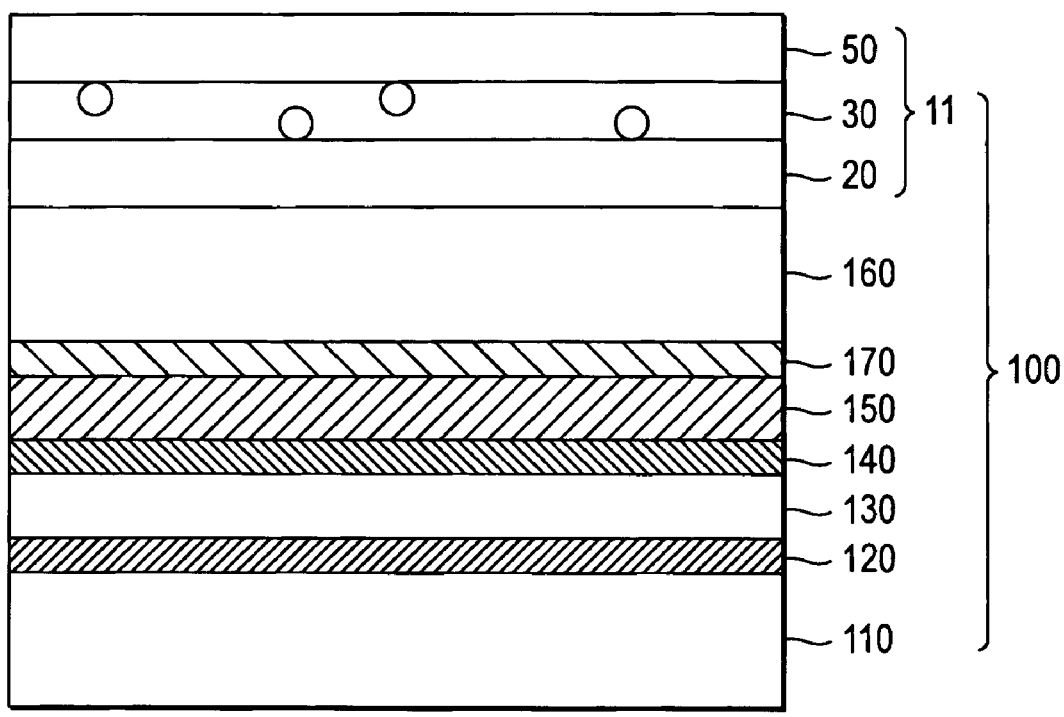
FIG. 6 is a typical view showing the constitution of one embodiment of the invention,
wherein
1 denotes TFT substrate
2 denotes Back electrode
3 denotes Organic layer including light-emitting layer
4 denotes Transparent or translucent electrode
5 denotes Transparent substrate
10 denotes Light scattering film 1
11 denotes Light scattering film 2
20 denotes Transparent substrate film
30 denotes Light scattering layer
31 denotes Light transmitting resin
41 denotes Light scattering particle
50 denotes Low refractive index layer
100 denotes Organic EL display
110 denotes TFT substrate
120 denotes Lower electrode
130 denotes Organic EL layer
140 denotes Upper electrode
150 denotes Gas barrier layer
160 denotes Transparent substrate
170 denotes Adhesive layer.

FIG. 2 is a typical cross-sectional view showing a fundamental structure of a light scattering film. Light scattering film 10 shown in FIG. 2 comprises transparent substrate film 20 and light scattering layer 30. Light scattering layer 30 contains light scattering particles 41 in light transmitting resin 31. Light scattering layer 30 may comprise a plurality of layers. Two or more kinds of light scattering particles may be used. As shown in FIG. 3, antireflection film 11 having the construction of lamination of low refractive index layer 50 on the opposite side of transparent substrate film 20 of light scattering layer 30 is more preferred in the points of not only improvement of viewing angle characteristics but also bright room contrast and prevention of mirroring in the surface of a display.

A Light Scattering Layer:

Light scattering layer 30 contains light scattering particles 41 and light transmitting resin 31. For the purpose of improving viewing angle characteristics of an organic EL display, it is important to optimize scattered light profile (the angle dependency of scattered light). Although a haze value is sometimes used as a simple index of scattering, angle dependency is not revealed, so that it is difficult to define optimal scattering by a haze value alone. Scattered light profile can be adjusted by the refractive index and the particle size of each of light scattering particles 41 and light transmitting resin 31. In general, when particles having different refractive index from that of a light transmitting resin are present in the light transmitting resin, the light incident upon the particles are scattered by the particles. The light scattered and returned to the incident side is called a backward scattering factor and the light scattered forward is called a forward scattering factor hereafter. As a result of examination of scattered light profile suitable for the improvement of viewing angle dependency of the organic EL display, it has been found that, when a backward scattering factor is small (a forward scattering factor is large), a scattering efficiency of forward scattering is high (a direct advance factor is small) and scattering of 30° factor in the forward scattering factor satisfies necessary amount, a preferred improving effect of viewing angle characteristics can be obtained and original design of scattering is necessary.

Scattered light profile of a light scattering layer is described in detail below. A forward scattering factor can be defined by asymmetry parameter g (the value of the coefficient of scattering anisotropy; the calculated value described in Bohren-Huffman, Absorption and Scattering of Light by Small Particles, 3.4). The asymmetry parameter g is preferably from 0.70 to 0.98, and more preferably from 0.80 to 0.95. When the parameter is less than 0.70, backward scattering is great and thereby luminance tends to lower, while when the parameter is greater than 0.98, scattering efficiency is worse and thereby an improving effect of viewing angle dependency tends to be little.

Scattering efficiency e can be computed as e=n×C from scattering cross section C and number of particles n based on Mie scattering theory. Scattering efficiency e is preferably from 0.05 to 12.0, more preferably from 0.05 to 3.0, still more preferably from 0.5 to 2.5, and especially preferably from 1.0 to 2.5. When scattering efficiency e is less than 0.05, the amount of scattering is insufficient and the improving effect of the characteristics of viewing angle of tint tends to be little, while when it is greater than 12.0, the amount of scattering is too big, and thereby frontal luminance and feeling of discoloration tend to worsen.

In connection with a 30° factor in the forward scattering factor, a scattering profile can be measured with a goniophotometer. For example, a light scattering film is arranged vertically to incident light with an automatic varied angle photometer Model GP-5 (manufactured by Murakami Color Research Laboratory) and the scattered light profile is measured. With the value in the direction of 0° (direct advance direction) of the forward scattering factor being $I_0$, and the value in the direction of 30° (the direction inclined by 30° from the direct advance direction) of the forward scattering factor being $I_{30}$, $I_{30}/I_0$ is preferably from 0.08 to 0.99, more preferably from 0.08 to 0.80, and especially preferably from 0.5 to 0.8. When $I_{30}/I_0$ is less than 0.08, the effect of angle dependency improvement tends to be little, while when it is greater than 0.99, frontal luminance tends to lower.

When three parameters of asymmetry parameter g, scattering efficiency e, and $I_{30}/I_0$ are satisfied at the same time, especially preferred performances can be revealed.

For achieving the scattering profile as described above, it is necessary that the ratio of the refractive index of light scattering particles (np) to the refractive index of a light transmitting resin (nb) (np/nb) and the particle size of light scattering particles be selected into preferred ranges.

Light Scattering Particles:

It is necessary for the refractive index of light scattering particles (np) to make the ratio to the refractive index of a light transmitting resin (nb) (np/nb) to a specific range. The ratio of the refractive index of light scattering particles (np) to the refractive index of a light transmitting resin (nb) (np/nb) is necessarily 0.80 or more and 0.95 or less, or 1.05 or more and 1.35 or less, and preferably 0.80 or more and 0.92 or less, or 1.08 or more and 1.20 or less. When (np/nb) is smaller than 0.80 or larger than 1.35, backward scattering is great and frontal luminance tends to lower, while when it is larger than 0.95 and smaller than 1.05, a sufficient scattering effect cannot be obtained and the effect of viewing angle dependency improvement is not sufficient. The particle size of light scattering particles is important as well as the difference in refractive index. The particle size of light scattering particles is from 0.3 μm to 1.2 μm, preferably from 0.4 μm to 1.0 μm, and more preferably from 0.5 μm to 1.0 μm. When the particle size is less than 0.3 μm, backward scattering is great and thereby there is a problem that luminance lowers, while when the particle size is more than 1.2 μm, preferred scattered angle distribution cannot be obtained and the effect of angle dependency improvement is not sufficient. It is necessary to use light scattering particles having these refractive index and particle size as described above at the same time to obtain the advantage of the invention.

Light scattering particles may be used by one kind alone, or a plurality of kinds may be used in combination. Two or more kinds of particles having the above scattered light profile may be used in combination, or it is also preferred to use one kind of particles having the above scattered light profile and form surface unevenness with other greater particles.

Light scattering particles may be organic fine particles or inorganic fine particles. As light scattering particles, particles having high transparency and the value of refractive index difference between that of light transmitting resin as described above are especially preferred. As organic fine particles, polymethyl methacrylate beads (refractive index: 1.49), acryl beads (refractive index: 1.50), acryl-styrene copolymer beads (refractive index: 1.54), melamine beads (refractive index: 1.57), high refractive index melamine beads (refractive index: 1.65), polycarbonate beads (refractive index: 1.57), styrene beads (refractive index: 1.60), crosslinked polystyrene beads (refractive index: 1.61), polyvinyl chloride beads (refractive index: 1.60), benzoguanamine-melamine-formaldehyde beads (refractive index: 1.68), and silicone beads (refractive index: 1.50) are used. As inorganic fine particles, silica beads (refractive index: 1.44), alumina beads (refractive index: 1.63), titanium oxide beads (refractive index of anatase type: 2.50, rutile type: 2.70), zirconia oxide beads (refractive index: 2.05), and zinc oxide beads (refractive index. 2.00) are used. By using light transmitting resin 31 having refractive indexes suitable for respective particles, it is possible to make difference in refractive index between light transmitting resin and light scattering particles in the above-mentioned specific range. As preferred organic fine particles, polymethyl methacrylate beads (refractive index: 1.49), acryl beads (refractive index: 1.50), acryl-styrene copolymer beads (refractive index: 1.54), melamine beads (refractive index: 1.57), high refractive index melamine beads (refractive index: 1.65), polycarbonate beads (refractive index: 1.57), styrene beads (refractive index: 1.60), crosslinked polystyrene beads (refractive index: 1.61), polyvinyl chloride beads (refractive index: 1.60), benzoguanamine-melamine-formaldehyde beads (refractive index: 1.68), and silicone beads (refractive index: 1.50) are used. As preferred inorganic fine particles, silica beads (refractive index: 1.44) and alumina beads (refractive index: 1.63) are used. As a light transmitting resin used in the light scattering layer, from the points of selectivity of materials, interference unevenness, surface condition, costs, etc., materials having a refractive index of 1.50 to 1.54 obtainable by curing ordinary polyfunctional polymers are preferably used. In that case, as a resin particle which obtains a refractive index difference necessary for revealing a scattering property preferable in the invention and which has advantage in productivity such as a sedimentation property, high refractive index melamine beads (refractive index: 1.65) and benzoguanamine-melamine-formaldehyde beads (refractive index: 1.68) are especially preferred. As a high refractive index melamine bead, a melamine-silica crosslinked particle (OPTOBEADS, manufactured by Nissan Chemical Industries, Ltd.) can be also used.

The light scattering particles are preferably contained in an amount of from 5 to 50 mass parts per 100 mass parts of the light transmitting resin, more preferably from 10 to 45 mass parts, and especially preferably from 20 to 40 mass parts. When the content of the light scattering particles is less than 5 mass parts per 100 mass parts of the light transmitting resin, light scattering tends to be insufficient, and when the amount is more than 50 mass parts back scattering tends to become large and film strength tends to be weakened.

In the case of the above light scattering particles, the light scattering particles are liable to precipitate in the light transmitting resin, so that inorganic fillers such as silica and the like may be added for the purpose of precipitation prevention. Incidentally, the more the addition amount of inorganic fillers, the more effective is the precipitation prevention of the light scattering particles, but the transparency of the film is mal-affected or the scattering property is influenced. Accordingly, it is preferred to add inorganic fillers having a particle size of 0.1 µm or less difficult to affect the scattering property to a Light transmitting resin in an amount of less than 1 mass % so as not to impair transparency of a coated film.

A Light Transmitting Resin:

As light transmitting resin 31, resins curable with ultraviolet, electron beams or heat, i.e., three kinds of ionizing radiation-curable resins, ionizing radiation-curable resins mixed with a thermoplastic resin and a solvent, and thermosetting resins are used. The thickness of a light scattering layer is generally from 0.5 to 50 µm or so, preferably from 1 to 20 µm, more preferably from 2 to 10 µm, and most preferably from 3 to 7 µm. The refractive index of a light transmitting resin is preferably from 1.48 to 2.00, more preferably from 1.50 to 1.90, still more preferably from 1.50 to 1.85, and especially preferably from 1.50 to 1.80. When the refractive index is lower than 1.48, the strength tends to lower, and when it is higher than 2.00, the strength tends to lower and interference unevenness tends to occur easily.

Binders for use in light transmitting resins are preferably polymers having saturated hydrocarbon or polyether as the main chain, and more preferably polymers having saturated hydrocarbon as the main chain. Binders are preferably crosslinked. It is preferred to obtain the polymers having saturated hydrocarbon as the main chain by polymerization reaction of ethylenic unsaturated monomers. To obtain crosslinked binders, it is preferred to use monomers having two or more ethylenic unsaturated groups.

The examples of the monomers having two or more ethylenic unsaturated groups include esters of polyhydric alcohol and (meth)acrylic acid (e.g., ethylene glycol di(meth)acrylate, 1,4-dicyclohexane diacrylate, pentaerythritol tetra (meth)acrylate, pentaerythritol tri(meth)acrylate, trimethylolpropane tri(meth)acrylate, trimethylolethane tri(meth) acrylate, dipentaerythritol tetra(meth)acrylate, dipentaerythritol penta(meth)acrylate, dipentaerythritol hexa (meth)acrylate, 1,3,5-cyclohexanetriol trimethacrylate, polyurethane polyacrylate, and polyester polyacrylate), vinylbenzene derivatives (e.g., 1,4-divinylbenzene, 4-vinylbenzoic acid-2-acryloyl ethyl ester, 1,4-divinylcyclohexanone), vinylsulfone (e.g., divinylsulfone), acrylamide (e.g., methylenebisacrylamide), and methacrylamide. Of these monomers, acrylate and methacrylate monomers having at least three functional groups, and acrylate monomers having at least five functional groups are preferred in the point of film hardness, that is, scratch resistance. Mixtures of dipentaerythritol pentaacrylate and dipentaerythritol hexaacrylate are commercially available and especially preferably used. These monomers may be used by one kind alone, or may be used as mixtures of two or more kinds.

These monomers having ethylenic unsaturated groups can be hardened by dissolving in a solvent together with various kinds of polymerization initiators and other additives, coating and drying, and then polymerization reaction with ionizing radiation or heating.

In place of or in addition to the monomers having two or more ethylenic unsaturated groups, a crosslinking structure may be introduced into binders by the reaction of crosslinkable groups. The examples of crosslinkable functional groups include an isocyanate group, an epoxy group, an aziridine group, an oxazoline group, an aldehyde group, a carbonyl group, a hydrazine group, a carboxyl group, a methylol group and an active methylene group. Vinylsulfonic acid, acid anhydride, cyanoacrylate derivatives, melamine, etherified methylol, ester and urethane, and metal alkoxides such as tetramethoxysilane can also be used as monomers to introduce a crosslinking structure. Functional groups showing a crosslinking property as a result of decomposition reaction may be used as a block isocyanate group. That is to say, crosslinkable functional groups in the invention may be those not showing reaction immediately but showing reactivity as a result of decomposition. The binders containing these crosslinkable functional groups can form a crosslinking structure by heating after coating.

It is also preferred for a light transmitting resin to be formed by the addition of at least one of a monomer having a high refractive index and hyperfine particles of a metal oxide in addition to the binder polymer for the purpose of the adjustment of the refractive index. Hyperfine particles of metal oxides are preferably used from the point of the improvement of hardness. The examples of high refractive index monomers include bis(4-methacryloylthiophenyl) sulfide, vinylnaphthalene, vinylphenyl sulfide, and 4-methacryloxyphenyl-4'-methoxyphenylthio ether. As the examples of the hyperfine particles of metal oxides, hyperfine particles of oxides containing at least one kind of a metal selected from Si, Al, Zr, Zn, Ti, In, Sb and Sn are preferred, and specifically $SiO_2$, $ZrO_2$, $TiO_2$, $Al_2O_3$, $In_2O_3$, ZnO, $SnO_2$, $Sb_2O_3$ and ITO are exemplified. Of these metal oxides, $ZrO_2$ is especially preferably used. The addition amount of the high refractive index monomers is preferably from 10 to 90 mass % of all the mass of the light transmitting resin, and more preferably from 20 to 80 mass %. The addition amount of the hyperfine particles of metal oxides is preferably from 0 to 50 mass parts per 100 mass parts of the light transmitting resin, more preferably from 0 to 45 mass parts, and especially preferably from 0 to 40 mass parts. When the content of the hyperfine particles of metal oxides is greater than 50 mass parts per 100 mass parts of the light transmitting resin, the resulting film strength tends to weaken.

When a light transmitting resin and a transparent substrate film are brought into contact, the solvent in a coating solution for forming a light transmitting resin preferably consists of at least one or more solvents capable of dissolving the transparent substrate film (e.g., a triacetyl cellulose support) and at least one or more solvents not capable of dissolving the transparent substrate film for the purpose of the compatibility of revelation of an antiglare property and close adhesion of the support (the transparent substrate film) and the light scattering layer. More preferably, the boiling point of at least one solvent of the solvents not dissolving the transparent substrate film is higher than the boiling point of at least one solvent of the solvents capable of dissolving the transparent substrate film. Still more preferably, the difference in temperature of the boiling point between the solvent having the highest boiling point of the solvents not dissolving the transparent substrate film and the solvent having the highest boiling point of the solvents capable of dissolving the transparent substrate film is 30° C. or higher, and most preferably 50° C. or higher.

As the solvents capable of dissolving the transparent substrate film, describing the case of using cellulose acetate as the transparent substrate film as an example, ethers having from 3 to 12 carbon atoms, specifically dibutyl ether, dimethoxymethane, dimethoxyethane, diethoxyethane, propylene oxide, 1,4-dioxane, 1,3-dioxolan, 1,3,5-trioxane, tetrahydrofuran, anisole, and phenetole; ketones having from 3 to 12 carbon atoms, specifically acetone, methyl ethyl ketone, diethyl ketone, dipropyl ketone, diisobutyl ketone, cyclopentanone, cyclohexanone, methylcyclohexanone, and methylcyclohexanone; esters having from 3 to 12 carbon atoms; specifically ethyl formate, propyl formate, n-pentyl formate, methyl acetate, ethyl acetate, methyl propionate, ethyl propionate, n-pentyl acetate, and γ-butyrolactone; and organic solvents having two or more kinds of functional groups, specifically 2-methoxymethyl acetate, 2-ethoxymethyl acetate, 2-ethoxyethyl acetate, 2-ethoxyethyl propionate, 2-methoxyethanol, 2-propoxyetanol, 2-butoxyethanol, 1,2-diacetoxyacetone, acetylacetone, diacetone alcohol, methyl acetoacetate, and ethyl acetoacetate are exemplified. These solvents can be used by one kind alone, or two or more kinds in combination. As the solvents for dissolving the transparent substrate film, ketone series solvents are preferably used.

As the solvents not dissolving the transparent substrate film, describing the case of using cellulose acetate as the transparent substrate film as an example, methanol, ethanol, 1-propanol, 2-propanol, 1-butanol, 2-butanol, tert-butanol, 1-pentanol, 2-methyl-2-butanol, cyclohexanol, isobutyl acetate, methyl isobutyl ketone, 2-octanone, 2-pentanone, 2-hexanone, 2-heptanone, 3-pentanone, 3-haptanone, 4-heptanone and toluene are exemplified. These solvents can be used by one kind alone, or two or more kinds in combination.

The above are described taking the case of using cellulose acetate as the transparent substrate film as an example, the solvents to be used are different according to the substrates. Further, when a transparent substrate film that is difficultly dissolved in a solvent is used, it is also preferred to form an easily adhering layer on the substrate and then form a light scattering layer on the easily adhering layer.

The proportion in mass of the total amount of the solvents capable of dissolving the transparent substrate film (A) and the total amount of the solvents not dissolving the transparent substrate film (B) [(A)/(B)] is preferably from 5/95 to 50/50, more preferably from 10/90 to 40/60, and still more preferably from 15/85 to 30/70.

The ionizing radiation-curable resin compositions as described above can be cured by the above-described ordinary curing methods of the ionizing radiation-curable resin compositions, that is, irradiation with electron beams or ultraviolet rays.

For example, in the case of curing with electron beams, electron beams having energies of from 50 to 1,000 keV, preferably from 100 to 300 keV, emitted from various kinds of electron beam accelerators such as a Cockcrost Walton type, a Van de Graaff type, a resonance transformer type, an insulating core transformer type, a linear type, a Dynamitron type, and a high frequency type are used, and in the case of curing with ultraviolet rays, ultraviolet rays emitted from light of rays such as a super-high pressure mercury lamp, a high pressure mercury lamp, a low pressure mercury lamp, a carbon arc, a xenon arc, and a metal halide lamp can be used.

When the light scattering film for use in the invention is used on the outermost surface of the display, it is preferred to have a hard coat property. By possessing a hard coat property, it is not necessary to provide a light scattering layer and a hard coat layer separately in two layers, so that the invention is excellent in productivity and manufacturing costs, which is one advantage of the invention. The hardness of the light scattering layer is preferably H or higher in the pencil hardness test, more preferably 2H or higher and most preferably 3H or higher.

Further, in the taper test in conformity with JIS K5400, the abrasion loss of a test piece before and after the test is preferably the smaller.

When the light scattering film for use in the invention is used on the outermost surface of the display, the surface unevenness is also important. Although it is possible to provide unevenness to give an antiglare property to the surface and obscure mirroring in to the display surface, it is more preferred not to have surface unevenness for the improvement of contrast, and center line average roughness Ra is preferably in the range of from 0.003 to 0.20 µm, more preferably in the range of from 0.005 to 0.15 µm, and still more preferably in the range of from 0.005 to 0.10 µm. When Ra exceeds 0.20 µm, there tend to arise problems of the occurrence of whitening of the surface and a blur of letters at the time when outer light is reflected.

The hardness and surface unevenness described above can be preferably applied to the later-described antireflection film comprising a light scattering layer having provided a low refractive index layer on the surface thereof.

A Low Refractive Index Layer:

When the light scattering film for use in the invention is used on the surface of the organic EL display, a low refractive index layer can be provided on the outside of the light scattering layer, that is, the farther side from the transparent substrate film. By possessing the low refractive index layer, an antireflection property is given to the light scattering film, and mirroring in onto the surface of the display can be prevented, so that the improvement of contrast becomes possible. It is preferred to set the refractive index of the low refractive index layer lower than that of the light scattering layer. When the difference in the refractive index between the low refractive index layer and the light scattering layer is too small, an antiglare property lowers, while when the difference is too large, the tint of reflected light is liable to be stronger. The difference in the refractive index between the low refractive index layer and the light scattering layer is preferably 0.01 or more and 0.30 or less, and more preferably 0.05 or more and 0.20 or less.

The low refractive index layer can be formed using materials of low refractive index. As the materials of low refractive index, low refractive index binders can be used. It is also possible to form the low refractive index layer by adding the particles to the binders.

The composition for forming the low refractive index layer can contain the later-described organosilane compounds.

The low refractive index binder can preferably contain a fluorine-containing copolymer. It is preferred for the fluorine-containing copolymer to contain a structural unit derived from a fluorine-containing vinyl monomer and a structural unit to impart a crosslinking property.

Fluorine-Containing Copolymer:

As the fluorine-containing vinyl monomers mainly constituting fluorine-containing copolymers, fluoroolefins (e.g., fluoroethylene, vinylidene fluoride, tetrafluoroethylene, hexafluoropropylene, etc.), partially or completely fluorinated alkyl ester derivatives of (meth)acrylic acid (e.g., Viscoat 6FM (trade name), manufactured by Osaka Organic Chemical Industry Ltd., R-2020 (trade name), manufactured by Daikin Industries Ltd., etc.), and completely or partially fluorinated vinyl ethers are exemplified. The preferred are perfluoroolefins, and the especially preferred is hexafluoropropylene from the points of refractive index, solubility, transparency and easy availability.

The refractive index can be lowered by the increase of the compositional ratio of the fluorine-containing vinyl monomer, but the film strength is liable to decrease on the other hand. It is preferred in the invention to introduce the fluorine-containing vinyl monomers so that the fluorine content in the fluorine-containing copolymer is from 20 to 60 mass %, more preferably from 25 to 55 mass %, and especially preferably from 30 to 50 mass %.

As the constitutional units for giving crosslinking reactivity, the units shown by the following (A), (B) and (C) are mainly exemplified.

(A) Constitutional units obtained by polymerization of monomers having self-crosslinking functional groups in the molecule in advance such as glycidyl (meth)acrylate and glycidyl vinyl ether;

(B) Constitutional units obtained by polymerization of monomers having a carboxyl group, a hydroxyl group, an amino group, or a sulfo group (e.g., (meth)acrylic acid, methylol (meth)acrylate, hydroxyalkyl (meth)acrylate, allyl acrylate, hydroxyethyl vinyl ether, hydroxybutyl vinyl ether, maleic acid, crotonic acid, etc.); and (C) Constitutional units capable of obtaining by reaction of a compound having functional groups reactive with functional groups (A) and (U) and crosslinking functional groups different from the above groups in the molecule with constitutional units (A) and (R) (e.g., constitutional units capable of synthesizing by a method of acting acrylic acid chloride to a hydroxyl group); are exemplified.

The above constitutional units (C) preferably have a photo-polymerizable group as the crosslinkable functional group. As the photo-polymerizable groups, e.g., a (meth)acryloyl group, an alkenyl group, a cinnamoyl group, a cinnamylideneacetyl group, a benzalacetophenone group, a styrylpyridine group, an α-phenylmaleimido group, a phenyl azide group, a sulfonyl azide group, a carbonyl azide group, a diazo group, an o-quinonediazide group, a furylacryloyl group, a coumarin group, a pyrone group, an anthracene group, a benzophenone group, a stilbene group, a dithiocarbamate group, a xanthate group, a 1,2,3-thiadiazole group, a cyclopropene group, and an azadioxabicyclo group can be exemplified. These groups may be used not only by one kind alone but also two or more groups in combination. Of these groups, a (meth)acryloyl group and a cinnamoyl group are preferred, and a (meth)acryloyl group is especially preferred.

As specific methods for preparing photo-polymerizable group-containing copolymers, the following methods can be exemplified, but the invention is not restricted to these methods.

(a) A method of esterification by reacting a crosslinkable functional group-containing copolymer containing a hydroxyl group with (meth)acrylic acid chloride;

(b) A method of making urethane by reacting a crosslinkable functional group-containing copolymer containing a hydroxyl group with (meth)acrylate containing an isocyanate group;

(c) A method of esterification by reacting a crosslinkable functional group-containing copolymer containing an epoxy group with (meth)acrylic acid; and (d) A method of esterification by reacting a crosslinkable functional group-containing copolymer containing a carboxyl group with (meth)acrylate containing an epoxy group.

Incidentally, the amount of photo-polymerizable groups to be introduced can be arbitrarily adjusted and a carboxyl group and a hydroxyl group may be left from the points of stability of film surface, reduction of surface failure in the coexistence of inorganic particles, and improvement of film strength.

In the invention, the amount of constitutional unit to be introduced for the purpose of giving a crosslinking property in a fluorine-containing copolymer is preferably from 10 to 50 mol %, more preferably from 15 to 45 mol %, and especially preferably from 20 to 40 mol %.

In copolymers useful for the low refractive index layer in the invention, besides the repeating units derived from the fluorine-containing vinyl monomers and repeating units having a (meth)acryloyl group on the side chain of the constitutional unit for imparting a crosslinking property, other vinyl monomers can be copolymerized arbitrarily from various points such as adhesion to the substrate, Tg of the polymer (contributing to the film thickness), solubility in solvents, transparency, a sliding property, dust proof and antifouling properties. These vinyl monomers may be used in combination of two or more according to purposes. These vinyl monomers are preferably contained in the range of from 0 to 65 mol % in total in the copolymer, more preferably in the range of from 0 to 40 mol %, and especially preferably in the range of from 0 to 30 mol %.

The vinyl monomer units usable in combination are not especially restricted, and, for example, olefins (e.g., ethylene, propylene, isoprene, vinyl chloride, vinylidene chloride, etc.), acrylic acid esters (e.g., methyl acrylate, ethyl acrylate, 2-ethylhexyl acrylate, 2-hydroxyethyl acrylate), methacrylic acid esters (e.g., methyl methacrylate, ethyl methacrylate, butyl methacrylate, 2-hydroxyethyl methacrylate, etc.), styrene derivatives (e.g., styrene, p-hydroxymethylstyrene, p-methoxystyrene, etc.), vinyl ethers (e.g., methyl vinyl ether, ethyl vinyl ether, cyclohexyl vinyl ether, hydroxyethyl vinyl ether, hydroxybutyl vinyl ether. etc.), vinyl esters (e.g., vinyl acetate, vinyl propionate, vinyl cinnamate, etc.), unsaturated carboxylic acids (acrylic acid, methacrylic acid, crotonic acid, maleic acid, itaconic acid, etc.), acrylamides (e.g., N,N-dimethylacrylamide, N-t-butylacrylamide, N-cyclohexylacrylamide, etc.), and methacrylamides (e.g., N,N-dimethylmethacrylamide, acrylonitrile, etc.) can be exemplified.

Especially useful fluorine-containing copolymers in the invention are random copolymers of perfluoroolefin and vinyl ethers or vinyl esters. It is particularly preferred to have a group capable of crosslinking singly (radical reactive groups such as a (meth)acryloyl group, ring opening polymerizable groups such as an epoxy group, an oxetanyl group, etc.). These polymerization units containing the crosslinking reactive group preferably account for from 5 to 70 mol % of all the polymerization units of the polymer, and especially preferably from 30 to 60 mol %. As preferred polymers, those disclosed in JP-A-2002-243907, JP-A-2002-372601, JP-A-2003-26732. JP-A-2003-222702, JP-A-2003-294911, JP-A-2003-329804, JP-A-2004-4444, and JP-A-2004-45462 can be exemplified.

It is preferred that a polysiloxane structure is introduced into the fluorine-containing copolymers useful in the invention for the purpose of giving an antifouling property. The introducing methods of a polysiloxane structure are not restricted. For example, a method of introducing a polysiloxane block copolymer component by using a silicone macroazo initiator as disclosed in JP-A-6-93100, JP-A-11-189621, JP-A-11-228631, and JP-A-2000-313709, and a method of introducing a polysiloxane graft copolymer component by using a silicone macromer as disclosed in JP-A-2-251555 and JP-A-2-308806 are preferred. As especially preferred compounds, the polymers disclosed in Examples 1, 2 and 3 in JP-A-11-189621, and Copolymers A-2 and A-3 disclosed in JP-A-2-251555 can be exemplified. It is preferred that these polysiloxane components account for from 0.5 to 10 mass % of the polymer, and especially preferably from 1 to 5 mass %.

The preferred molecular weight of the fluorine-containing copolymers preferably used In the invention is 5,000 or more as mass average molecular weights preferably from 10,000 to 500,000, and most preferably from 15,000 to 200,000. By using polymers different in average molecular weights, the state of film surface and scratch resistance can also be improved.

A hardening agent having a polymerizable unsaturated group may be arbitrarily used in these fluorine-containing copolymers as disclosed in JP-A-10-25388 and JP-A-2000-17028. As disclosed in JP-A-2002-145952, it is also preferred to use in combination of a compound having a fluorine-containing polyfunctional polymerizable unsaturated group. As the examples of the compounds having a polyfunctional polymerizable unsaturated group, the polyfunctional monomers described in the above light scattering layer can be exemplified. These compounds have a great effect of the improvement of scratch resistance particularly when a compound having a polymerizable unsaturated group is used in the copolymer main body.

The refractive index of the low refractive index layer is preferably from 1.20 to 1.46, more preferably from 1.25 to 1.42, and especially preferably from 1.30 to 1.38. The thickness of the low refractive index layer is preferably from 50 to 150 nm, and more preferably from 70 to 120 nm.

Fine Particles:

Fine particles preferably usable in the low refractive index layer in the invention will be described below.

The coating weight of the fine particles contained in the low refractive index layer is preferably from 1 to 100 mg/m$^2$, more preferably from 5 to 80 mg/m$^2$, and still more preferably from 1 to 70 mg/m$^2$. When the coating weight of the fine particles is more than the greatest lower bound, an improving effect of scratch resistance is apparently revealed, and when less than the least upper bound, minute irregularities are formed on the surface of the low refractive index layer, so that unfavorable states such as deteriorations in appearance and integrated reflectance do not occur and preferred. Since the fine particles are contained in the low refractive index layer, the refractive index is preferably low.

Specifically, fine particles contained in the low refractive index layer are inorganic fine particles, hollow inorganic fine particles, or hollow organic fine particles, and they are preferably low in refractive index. Hollow inorganic fine particles are especially preferred. As the inorganic fine particles, e.g., silica fine particles and hollow silica fine particles are exemplified. The average particle size of these fine particles is preferably 30% or more and 100% or less of the thickness of the low refractive index layer, more preferably 30% or more and 80% or less, and still more preferably 35% or more and 70% or less. That is, when the thickness of the low refractive index layer is 100 nm, the particle size of the fine particles is preferably 30 nm or more and 100 nm or less, more preferably 30 nm or more and 80 nm or less, and still more preferably 35 nm or more and 70 nm or less.

For contriving strengthening of scratch resistance, it is preferred that inorganic particles are contained in all the layers of the antiglare film, and most preferably silica particles are contained in all the layers of the antiglare film.

The improving effect of scratch resistance of the (hollow) silica fine particles is revealed when the particle size is greater than the greatest lower bound, and when less than the least upper bound, minute irregularities are formed on the surface of the low refractive index layer, so that unfavorable states such as deteriorations in appearance and integrated reflectance do not occur and preferred.

(Hollow) silica particles may be crystalline or amorphous, and may be monodisperse particles or agglomerated particles (in this case secondary particle size is preferably from 15 to 150% of the layer thickness of the low refractive index layer). Further, a plurality of two or more particles (in kinds or particle sizes) may be used. The shape of the particles is most preferably spherical, but may be amorphous.

For lowering the refractive index of the low refractive index layer, it is especially preferred to use hollow silica fine particles. The refractive index of the hollow silica fine particles is from 1.17 to 1.40, more preferably from 1.17 to 1.35, and still more preferably from 1.17 to 1.32. The refractive index here is the refractive index of the particles at large and not means the refractive index of the silica of the shell forming the hollow silica particles alone. At this time, void ratio x is computed from the following equation (1) taking the radius of the void in the particle as $r_i$, and the radius of the shell of the particle as $r_0$:

$$x=(4\pi r_i^3/3)/(4\pi r_0^3/3)\times 100 \quad (1)$$

Void ratio x is preferably from 10 to 60%, more preferably from 20 to 60%, and most preferably from 30 to 60%. To make the refractive index of the hollow silica particles lower and make the void ratio greater result in thinning of the thickness of the shell and weakening of the strength of the particles. From the viewpoint of scratch resistance, particles of a low refractive index of less than 1.17 are difficult to be used. The refractive index of the hollow silica particles can be measured with Abbe's refractometer (manufactured by Atago Co., Ltd.).

In the invention, from the aspect of the improvement of an antifouling property, it is preferred to further lower the surface free energy of the surface of the low refractive index layer. Specifically, fluorine compounds and compounds having a polysiloxane structure are preferably used in the low refractive index layer.

As the additives having a polysiloxane structure, reactive group-containing polysiloxane (e.g., "KF-100T", "X-22-169AS", "K-102", "X-22-3701IE", "X-22-164B", "X-22-5002", "X-22-173B", "X-22-174D", "X-22-167B", and "X-22-161AS" (trade names, manufactured by Shin-Etsu Chemical Co., Ltd.), "AK-5", "AK-30" and "AK-32" (trade names, manufactured by TOAGOSEI CO., LTD.), "Silaplane FM0725" and "Silaplane FM0721" (trade names, manufactured by Chisso Corporation)) are also preferably added. Further, silicone compounds shown in Tables 2 and 3 in JP-A-2003-112383 can also be preferably used.

As the fluorine compounds, compounds having a fluoroalkyl group are preferably used. The fluoroalkyl group preferably has from 1 to 20 carbon atoms, more preferably from 1 to 10 carbon atoms, may have a straight chain structure (e.g., $-CF_2CF_3$, $-CH_2(CF_2)_4H$, $-CH_2(CF_2)_8CF_3$, $-CH_2CH_2(CF_2)_4H$, etc.), may have a branched structure (e.g., $CH(CF_3)_2$, $CH_2CF(CF_3)_2$, $CH(CH_3)CF_2CF_3$, $CH(CH_3)(CF_2)_5CF_2H$, etc.), may have an alicyclic structure preferably a 5- or 6-membered ring, e.g., a perfluorocyclohexyl group, a perfluorocyclopentyl group, or an alkyl group substituted with these groups), or may have an ether bond (e.g., $CH_2OCH_2CF_2CF_3$, $CH_2CH_2OCH_2C_4F_8H$, $CH_2CH_2OCH_2CH_2C_8F_{17}$, $CH_2CH_2OCF_2CF_2OCF_2CF_2H$, etc.). A plurality of the fluoroalkyl groups may be contained in the same molecule.

It is preferred for the fluorine compounds to have substituents contributing to forming a bond to or compatibility with a low refractive index layer film, and it is preferred to have a plurality of substituents, and the substituents may be the same or different. The examples of preferred substituents include an acryloyl group, a methacryloyl group, a vinyl group, an aryl group, a cinnamoyl group, an epoxy group, an oxetanyl group, a hydroxyl group, a polyoxyalkylene group, a carboxyl group, and an amino group. The fluorine compounds may be polymers or oligomers with compounds not containing a fluorine atom, and the molecular weight is not especially restricted. The content of fluorine atoms in the fluorine compounds is not especially restricted, but preferably 20 mass % or more, especially preferably from 30 to 70 mass %, and most preferably from 40 to 70 mass %. As the examples of preferred fluorine compounds, R-2020, M-2020, R-3833, M-3833, and OPTOOL DAC (trade names, manufactured by Daikin Industries Ltd.), Megafac F-171, F-172, F-179A, DEFENSA MCF-300, and MCF-322 (trade names, manufactured by Dainippon Ink and Chemicals Inc.) are exemplified, but fluorine compounds are not restricted thereto. These fluorine compounds and compounds having a polysiloxane structure are preferably added in the range of from 0.1 to 10 mass % of all the solids content of the low refractive index layer, and especially preferably from 1 to 5 mass %.

A High Refractive Index Layer and an Intermediate Refractive Index Layer:

An antireflection property of the antireflection film in the invention can be heightened by providing a high refractive index layer between the transparent support of the light scattering layer and the low refractive index layer on the opposite side to make use of optical interference together with the low refractive index layer. Further, it is preferred to provide between the light scattering layer and the high refractive index layer an intermediate refractive index layer having a refractive index that is intermediate of the refractive indexes of the light scattering layer and the high refractive index layer.

In the specification of the invention hereafter, the high refractive index layer and the intermediate refractive index layer are sometimes generically referred to as a high refractive index layer. Incidentally, in the invention, "high", "intermediate" and "low" of the high refractive index layer, intermediate refractive index layer and low refractive index layer mean the relative small and great values of the refractive indexes among the layers. Further, describing the relationships with the transparent support, it is preferred that the refractive indexes satisfy the relationships of a transparent support>a low refractive index layer, a high refractive index layer>a transparent support.

Further, in the specification of the invention, a high refractive index layer, an intermediate refractive index layer and a low refractive index layer are sometimes generically referred to as an antireflection layer.

For manufacturing an antireflection film by forming a low refractive index layer on a high refractive index layer, the refractive index of the high refractive index layer is preferably from 1.55 to 2.40, more preferably from 1.60 to 2.20, and still more preferably from 1.60 to 2.00.

When an antireflection film is formed by coating an intermediate refractive index layer, a high refractive index layer, and a low refractive index layer in order nearer from the support, the refractive index of the high refractive index layer is preferably from 1.65 to 2.40, and more preferably from 1.70 to 2.20. The refractive index of the intermediate refractive index layer is adjusted so that the value is intermediate between the refractive index of the low refractive index layer and the refractive index of the high refractive index layer. The refractive index of the intermediate refractive index layer is preferably from 1.55 to 1.80, and mote preferably from 1.55 to 1.70.

The specific examples of inorganic particles for use in the high refractive index layer and the intermediate refractive index layer are preferably inorganic particles primarily comprising inorganic oxides, e.g., $TiO_2$, $ZrO_2$, $Al_2O_3$, $In_2O_3$, $ZnO$, $SnO_2$, $Sb_2O_3$, ITO, etc. Inorganic particles mainly comprising $SiO_2$ can also be used for the adjustment of the refractive index. For use in the high refractive index layer, $TiO_2$ and $ZrO_2$ are especially preferred to increase a refractive index. It is also preferred for the surfaces of inorganic fillers to be treated with a silane coupling agent or a titanium coupling agent, and surface treating agents having a functional group capable of reacting with the binder on the surface are preferably used.

The content of the inorganic particles in the high refractive index layer is preferably from 10 to 90 mass % of the mass of the high refractive index layer, more preferably from 15 to 80 mass %, and especially preferably from 15 to 75 mass %. Two or more kinds of inorganic particles can be used in combination in high refractive index layer.

When a low refractive index layer is formed on a high refractive index layer, the refractive index of the high refractive index layer is preferably higher than the refractive index of the transparent support.

The lower the reflectance of the antireflection film, the more preferred is the reduction of mirroring in or the improvement of contrast. The average value of the reflectance in the wavelength region of from 450 to 650 nm of mirror reflectivity in the incidence of 5° is preferably 0.1 to 2.0%, more preferably from 0.1 to 1.2%, and especially preferably from 0.1 to 0.6%. When the average value exceeds 2.0%, the effects of the reduction of mirroring in and the improvement of contrast are little, so that not preferred.

Since the antireflection film prevents reflection in a specific wavelength region by making use of thin film interference of one or more layers, there is a problem of reflected tint. The tints of regularly reflected light of the antireflection film to 5° incident light of CIE standard light source D65 in the wavelength region of from 380 to 780 nm as $a^*$ and $b^*$ values of CIE1976L*a*b* color space are respectively preferably in the range of $-8 \leq a^* \leq 8$ and $-10 \leq b^* \leq 10$, more preferably $-5 \leq a^*5$ and $-6 \leq b^* \leq 6$, especially preferably $0 \leq a^* \leq 5$ and $-6 \leq b^* \leq 0$, and still further preferably $0 \leq a^* \leq 3$ and $-4 \leq b^* \leq 0$. When these values exceed the above ranges respectively, reflected colors are conspicuous especially in black display, so that not preferred.

Besides the above layers, it is preferred that various functional groups are provided on the light scattering film for use in the invention. As the examples of the functional layers, a conductive layer, an easily adhesive layer and an absorptive layer are exemplified.

Forming of Layers:

The light scattering layer for use in the invention, and according to necessity, a low refractive index layer, a high/intermediate refractive index layer, or other layers are formed by coating a coating solution on a transparent support, heating, drying, and after that, if necessary, irradiating light and/or heating to harden the monomer and the curable resin for forming each layer.

The coating methods of each layer of the light scattering film in the invention are not especially restricted, but a dip coating method, an air knife coating method, a curtain coating method, a roller coating method, a wire bar coating method, a gravure coating method, an extrusion coating method (a die coating method) (refer to U.S. Pat. No. 2,681,294), and a micro-gravure coating method are used. Of these methods, a micro-gravure coating method and a die coating method are preferably used for high productivity and coating uniformity.

Further, for the purpose of the improvement of adhesion of the transparent substrate film and covering layers, one or both surfaces of the transparent substrate film can also be subjected to pretreatment such as hydrophilization treatment or treatment to make irregularities. As the pretreatments, corona discharge treatment, glow discharge treatment, chromic acid treatment (a wet type), saponification treatment (a wet type), flame treatment, hot air treatment, and ozone-UV irradiation treatment are exemplified, and corona discharge treatment, glow discharge treatment and saponification treatment (a wet type) are especially preferred.

Transparent Substrate Film:

As the materials of transparent substrate film 20, there are a transparent resin film, a transparent resin plate, and a transparent resin sheet. As the transparent resin films, films comprising cellulose acylates (e.g., a triacetyl cellulose (TAC) film (refractive index: 1.48)), polyethylene terephthalate (PET) films, polyethylene naphthalate (PEN) films, diacetylene cellulose films, acetate butyrate cellulose films, polyether sulfone films, polyacrylic resin films, polyurethane resin films, polyester films, polycarbonate films, polysulfone films, polyether films, polymethylpentene films, polyether ketone films, (meth)acrylonitrile films, cycloolefin films, and films comprising a polymer having a lactone ring can be used. The thickness of the transparent substrate film is generally preferably from 10 to 80 μm, and more preferably from 20 to 60 μm. In the invention, the thickness is preferably the thinner for the reduction of a blur of letters due to light scattering, but when the thickness is thinner than 10 μm, the film strength decreases, so that not preferred.

Organic Electroluminescent Display:

The organic electroluminescent display in the invention is a display comprising a pair of electrodes of the anode and the cathode and a light-emitting layer or a plurality of thin films of organic compounds including a light-emitting layer between the pair of electrodes, and the display may have a hole injecting layer, a hole transporting layer, an electron injecting layer, an electron transporting layer, and a protective layer besides the light-emitting layer, and each of these layers may have other function. Each layer can be formed with various kinds of materials.

The anode is to supply positive holes to a hole injecting layer, a hole transporting layer and a light-emitting layer, and metals, alloys, metal oxides, electrically conductive compounds, and mixtures of these materials can be used as the materials, and preferred materials are materials having a work function of 4 eV or more. The specific examples of the materials of the anode include electrically conductive metal oxides, e.g., tin oxide, zinc oxide, indium oxide, indium tin oxide (ITO), etc., metals, e.g., gold, silver, chromium, nickel, etc., mixtures or laminates of these metals with electrically conductive metal oxides, inorganic electrically conductive substances, e.g., copper iodide, copper sulfide, etc., organic electrically conductive materials, e.g., polyaniline, polythiophene, polypyrrole, etc., laminates of these materials with ITO, etc. Of these materials, electrically conductive metal oxides are preferred, and ITO is especially preferred in view of productivity, high conductivity, transparency and the like. The film thickness of the anode can be arbitrarily selected dependent upon materials, but generally it is preferably in the range of from 10 nm to 5 μm, more preferably from 50 nm to 1 μm, and still more preferably from 100 nm to 500 nm.

The substrate is not especially restricted, but a transparent or translucent substrate is preferably used, and generally the anode is formed on a substrate such as soda-lime glass, non-alkali glass, or a transparent resin. When glass is used, it is preferred to use non-alkali glass to lessen elution of ions from the glass. Further, when soda-lime glass is used, those having barrier coat of silica and the like are preferably used.

The thickness of the substrate is not especially restricted so long as the thickness is sufficient to maintain mechanical strength, but in the case where a light scattering film is used on the surface of the display as in the invention, when the thickness of the substrate on the viewing side is thick, a blur of letters is liable to occur, and the thickness of the substrate is preferably the thinner. The thickness of the substrate on the viewing side is preferably from 0.01 to 0.70 mm, more preferably from 0.02 to 0.50 mm, and especially preferably from 0.03 to 0.30 mm.

In the invention, for the compatibility of the improvement of viewing angle dependency and the reduction of a blur of letters, and in the points of the strength and the duration of life of the display, to use a thin substrate preferably glass) of from 0.03 to 0.30 mm on the viewing side can be said to be a most preferred mode. When a substrate is thinner than 0.30 μm, it is more preferred to coat a polymer on at least one of one-side surface and edge of the substrate.

For the reduction of a blur of letters, for example, it is also preferred to use a gas barrier film in place of a glass substrate as at least a substrate on a viewing side. The gas barrier film is a film comprising a plastic support provided with a gas-impermeable barrier layer. As the examples of the gas barrier films, the films vacuum evaporated with silicon oxide or aluminum oxide (JP-B-53-12953 (the term "JP-B" as used herein refers to an "examined Japanese patent publication") and JP-A-58-217344), the films having an organic and inorganic hybrid coating layer (JP-A-2000-323273 and JP-A-2004-25732), the films containing an inorganic laminar compound (JP-A-2001-205743), the films of laminates of inorganic materials (JP-A-2003-206361 and JP-A-2006-263989), the films of laminates of organic layer and inorganic layer alternately (JP-A-2007-30387, U.S. Pat. No. 6,413,645, Affinito et al., *Thin Solid Films*, pp. 290-291 (1996)), and the films of laminates of organic layer and inorganic layer continuously (U.S. Patent 2004-46,497) are exemplified. As the barrier property of the gas barrier film, water vapor permeability at 40° C. 90% RH is preferably 0.01 g/m$^2$·day or less, and more preferably 0.001 g/m$^2$·day or less.

The light scattering film can also be used by being stuck on the gas barrier film with an adhesive and the like.

As another embodiment of the invention, the light scattering film includes a gas barrier film and a light scattering layer directly formed on the gas barrier film, and the scattering film is used as at least a substrate on the viewing side for example in place of glass. This mode has the advantage that the improvement of viewing angle dependency and the reduction of a blur of letters can be reconciled and the film can be lightweight and thin-typed film.

Various methods are used in the manufacture of the anode dependent upon materials. For example, in the case of ITO, a film is formed according to an electron beam method, a sputtering method, a resistance heating vacuum evaporation method, a chemical reaction method (a sol-gel method and the like), or a method of coating the dispersion of indium tin oxide. The anode can lower driving voltage of a display or can increase emission efficiency by washing and other treatments. In the case of ITO, for example, UV-ozone treatment is effective.

The cathode is to supply electrons to an electron injecting layer, an electron transporting layer, and a light-emitting layer, and is selected by considering the adhesion with the layers contiguous to the negative electrode such as the electron injecting layer, electron transporting layer, and light-emitting layer, ionization potential and stability. As the materials of the cathode, metals, alloys, metal oxides, electrically conductive compounds, and mixtures of these materials can be used. As the specific examples of the materials of the cathode, alkali metals (e.g., Li, Na, K, etc.) and fluorides thereof, alkaline earth metals (e.g., Mg, Ca, etc.) and fluorides thereof, gold, silver, lead, aluminum, sodium-potassium alloys and mixed metals thereof, lithium-aluminum alloys and mixed metals thereof, magnesium-silver alloys and mixed metals thereof, and rare earth metals such as indium and ytterbium are exemplified, and preferred materials are materials having a work function of 4 eV or less. More preferred materials are aluminum, lithium-aluminum alloys and mixed metals thereof, and magnesium-silver alloys and mixed metals thereof. The film thickness of the cathode can be arbitrarily selected dependent upon materials, but generally it is preferably in the range of from 10 nm to 5 μm, more preferably from 50 nm to 1 μm, and still more preferably from 100 nm to 1 μm. An electron beam method, a sputtering method, a resistance heating vacuum evaporation method, and a coating method are used in the manufacture of the cathode, and simple substance of a metal can be evaporated or two or more components can be evaporated at the same time. Further, a plurality of metals may be evaporated at the same time to form an alloy electrode, or an alloy prepared in advance may be evaporated.

The sheet resistance of the anode and cathode is preferably low, for example, several hundreds Ω/□ or less is preferred.

The barrier film may be stuck on the cathode to prevent gas from invading and form a protective layer on the surface of the display.

Any material can be used as the materials of the light-emitting layer so long as the material is capable of forming a layer having functions of injecting positive holes from the anode, the hole injecting layer, or the hole transporting layer and at the same time injecting electrons from the cathode, the electron injecting layer, or the electron transporting layer when electric field is applied, function of transferring injected charges, and function of enabling light emission by offering a site for recombination of the holes and the electrons. Preferably for the light-emitting layer to contain the compound of the invention, but light-emitting materials other than the compound of the invention can also be used. The examples of other compounds include various metal complexes represented by metal complexes or rare earth complexes of benzoxazole derivatives, benzimidazole derivatives, benzothiazole derivatives, styrylbenzene derivatives, polyphenyl derivatives, diphenylbutadiene derivatives, tetraphenylbutadiene derivatives, naphthalimide derivatives, coumarin derivatives, perylene derivatives, perinone derivatives, oxadiazole derivatives, aldazine derivatives, pyraridine derivatives, cyclopentadiene derivatives, bisstyrylanthracene derivatives, quinacridone derivatives, pyrrolopyridine derivatives, thiadiazolopyridine derivatives, cyclopentadiene derivatives, styrylamine derivatives, aromatic dimethylidyne compounds, and 8-quinolinol derivatives, and polymer compounds such as polythiophene, polyphenylene, polyphenylenevinylene, etc. The film thickness of the light-emitting layer is not especially restricted, but generally preferably the film thickness is in the range of from 1 nm to 5 μm, more preferably from 5 nm to 1 μm, and still more preferably from 10 nm to 500 nm.

The forming method of the light-emitting layer is not especially restricted, and a resistance heating vacuum evaporation method, an electron beam method, a sputtering method, a molecular laminating method, a coating method (e.g., spin coating, cast coating, dip coating), and an LB method are used, and a resistance heating vacuum evaporation method and a coating method are preferably used.

The materials of the hole injecting layer and the hole transporting layer are sufficient if they have any of the functions of injecting positive holes from the anode, transporting positive holes, and blocking the electrons injected from the cathode. The specific examples of the materials include carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiaryl amine compounds, styrylamine compounds, aromatic dimethylidyne series compounds, porphyrin series compounds, polysilane series compounds, poly(N-vinylcarbazole) derivatives, aniline series copolymers, and electrically conductive high molecular weight oligomers, such as thiophene oligomers and polythiophene. The film thickness of the hole injecting layer and the hole transporting layer is not especially restricted, and generally it is preferably in the range of from 1 nm to 5 µm, more preferably from 5 nm to 1 µm, and still more preferably from 10 nm to 500 nm. The hole injecting layer and the hole transporting layer may have a single layer structure of one kind or two or more kinds of the above materials, or may be a multilayer structure comprising a plurality of layers having the same composition or different compositions.

As the forming method of the hole injecting layer and the hole transporting layer, a vacuum evaporation method, an LB method, a method of dissolving or dispersing the above hole injecting and hole transporting materials in solvents and coating (spin coating, cast coating or dip coating) are used. In the case of a coating method, the hole injecting and hole transporting materials can be dissolved or dispersed with a resin component. The examples of the resin components include polyvinyl chloride, polycarbonate, polystyrene, polymethyl methacrylate, polybutyl methacrylate, polyester, polysulfone, polyphenylene oxide, polybutadiene, poly(N-vinylcarbazole), hydrocarbon resin, ketone resins phenoxy resin, polyamide, ethyl cellulose, vinyl acetate, ABS resin, polyurethane, melamine resin, unsaturated polyester resin, alkyd resin, epoxy resin, silicone resin, and the like.

Materials of the electron injecting layer and the electron transporting layer are sufficient if they have any of the functions of injecting electrons from the cathode, transporting electrons, and barriering off the positive holes injected from the anode. The specific examples of the materials include various metal complexes represented by metal complexes of triazole derivatives, oxazole derivatives, oxadiazole derivatives, fluorenone derivatives, anthraquinodimethane derivatives, anthrone derivatives, diphenylquinone derivatives, thiopyrandioxide derivatives, carbodiimide derivatives, fluorenylidenemethane derivatives, distyrylpyrazine derivatives, heterocyclic tetracarboxylic acid anhydrides such as naphthalene and perylene, phthalocyanine derivatives, and 8-quinolinol derivatives, and metal complexes having a ligand such as metallophthalocyanine, benzoxazole or benzothiazole. The film thickness of the electron injecting layer and the electron transporting layer is not especially restricted, but it is generally preferably from 1 nm to 5 µm, more preferably from 5 nm to 1 µm, and still more preferably from 10 nm to 500 nm. The electron injecting layer and the electron transporting layer may be single layer structure comprising one or two or more of the above materials, or may be a multilayer structure comprising a plurality of layers having the same composition or different compositions.

As the forming method of the electron injecting layer and the electron transporting layer, a vacuum evaporation method, an LB method, a method of dissolving or dispersing the above electron injecting and electron transporting materials in solvents and coating (spin coating, cast coating or dip coating) are used. In the case of a coating method, the electron injecting and electron transporting materials can be dissolved or dispersed with a resin component. As the examples of the resin components include, for example, those exemplified in the positive hole injecting and transporting layers can be applied.

The materials of the protective layer are sufficient if they have the function of preventing substances that accelerate deterioration of the display, such as water or oxygen, from invading the display. The specific examples of the materials include metals such as In, Sn, Pb, Au, Cu, Ag, Al, Ml and Ni; metal oxides such as MgO, SiO, $SiO_2$, $Al_2O_3$, GeO, NiO, CaO, BaO, $Fe_2O_3$, $Y_2O_3$, and $TiO_2$; metal fluorides such as $MgF_2$, LiF, $AlF_3$, and $CaF_2$; polyethylene, polypropylene, polymethyl methacrylate, polyimide, polyurea, polytetrafluoroethylene, polychlorotrifluoroethylene, polydichlorodifluoroethylene, copolymers of chlorotrifluoroethylene and dichlorodifluoroethylene, copolymers obtained by copolymerization of a monomer mixture of tetrafluoroethylene and at least one comonomer, fluorine-containing copolymers having cyclic structures on the main chain, water-absorbing substances having a coefficient of water absorption of 1% or more, and moisture-proof substances having a coefficient of water absorption of 0.1% or less.

The forming method of the protective layer is also not especially restricted and, for example, a vacuum evaporation method, a sputtering method, a reactive sputtering method, an MBE (molecular beam epitaxy) method, a cluster ion beam method, an ion-plating method, a plasma polymerization method (a high frequency exciting ion plating method), a plasma CVD method, a laser CVD method, a heat CVD method, a gas source CVD method, and a coating method can be used.

In the organic EL display, light collecting effect can be improved by the photo-resonance of the lights reflected on the surface on the light-emitting layer side of each electrode between both electrodes. In such a case, viewing angle dependency is especially liable to occur, so that the effect of the invention is great. The effect of the invention is especially great in the organic EL display wherein the maximum value of emission wavelength is in the range of 350 nm or more and 700 nm or less, and $[(x_{60}-x_0)^2+(y_{60}-y_0)^2]^{1/2}$ is in the range of 0.05 or more and 0.3 or less, taking the color coordinate of emission spectrum in the direction of output angle of 0° on xy chromaticity diagram as $(x_0, y_0)$ and the color coordinate of emission spectrum in the direction of output angle of 60° as $(x_{60}, y_{60})$, and the effect of the invention is still further great in the organic EL display in the range of 0.1 or more and 0.2 or less. When the value is too great, viewing angle characteristics of the level that is a little unpleasant remains even by the invention, and when the value is too small, the effect of the invention tends to be hardly obtained.

The organic EL display in the invention has the light scattering film having the specific optical performances, so that the change in the tint is little when the image in the display is observed from various directions as compared with the case where the light scattering film is not used, and good display performance can be achieved.

EXAMPLE

The invention will be described in detail with reference to examples, but the invention is by no means restricted thereto. In the examples "parts" and "%" mean "mass parts" and "mass %" unless otherwise indicated.

The compounds used in the coating solutions for light scattering layers are shown below.

Particles 1: 0.5 µm melamine-silica crosslinked particles (OPTOBEADS 500S, refractive index: 1.65, manufactured by Nissan Chemical Industries, Ltd.)

Particles 2: 1.5 μm melamine-silica crosslinked particles, refractive index: 1.65
Particles 3: 0.1 μm melamine-silica crosslinked particles, refractive index: 1.65
Particles 4: 0.5 μm acryl-styrene crosslinked particles, refractive index: 1.53
Particles 5: 0.3 μm melamine-silica crosslinked particles, refractive index: 1.65
Particles 6: 1.1 μm melamine-silica crosslinked particles, refractive index: 1.65
Particles 7: 0.5 μm silica crosslinked particles, refractive index: 1.44 (SEAHOSTAR KE-P50, manufactured by Nippon Shokubai Co., Ltd.)
Particles 8: 0.5 μm polymethyl methacrylate crosslinked particles, refractive index: 1.50
Particles 9: 0.6 μm zinc oxide particles, refractive index: 1.95 (ZINC OXIDE 1, manufactured by Sakai Chemical Industry Co., Ltd.)
Particles 10: 0.38 μm titanium dioxide particles, refractive index: 2.52 (TA200, manufactured by Fuji Titanium Industry Co., Ltd.)

All of the particles 1-6 and 8 are used as dispersion in methyl isobutyl ketone (MIBK) (particle concentration: 38 wt %) dispersed with a POLYTRON disperser at 10,000 rpm for 20 minutes.

All of the particles 7, 9 and 10 are used as dispersion in methyl isobutyl ketone (MIBK) (particle concentration: 38 wt %) dispersed with an ultrasonic disperser for 20 minutes.

PET 30: Mixture of pentaerythritol triacrylate and pentaerythritol tetraacrylate (manufactured by Nippon Kayaku Co., Ltd.)
DPHA: Mixture of dipentaerythritol pentaacrylate and dipentaerythritol hexaacrylate (manufactured by Nippon Kayaku Co., Ltd.)
Viscoat V360: EO-modified trimethylolpropane triacrylate (manufactured by OSAKA ORGANIC CHEMICAL INDUSTRY LTD.)
DESOLITE Z7404: zirconia-containing UV-curable hardcoat liquid, solid contents concentration: about 61%, substituted to solvent methyl isobutyl ketone, content rate of $ZrO_2$ in solid contents: about 70%, polymnerizable monomer, polymerization initiator contained (manufactured by JSR Corporation)
Irgacure 127: A photoinitiator (manufactured by Ciba Specialty Chemicals Inc.)
CAB: Cellulose acetate butyrate
MEK: Methyl ethyl ketone
SP-13: A fluorine surfactant

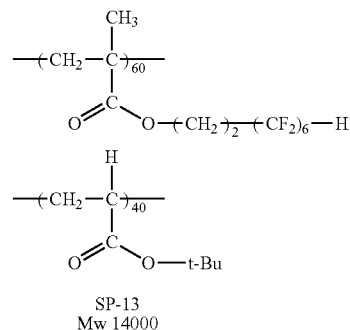

SP-13
Mw 14000

Example 1

Manufacture of Light Scattering Film Samples 101 to 109

Coating of Light Scattering Layer:

Each light scattering layer is prepared by unwinding a PET film with an easy adhesive layer having a thickness of 40 μm from a roll, coating with the coating solution for forming a light scattering layer shown in Table 1 below by a die coating method using a slot die disclosed in JP-A-2006-122889, Example 1, on the condition of coating at conveying rate of 30 m/min, and after drying at 60° C. for 150 seconds, under nitrogen-purging and oxygen concentration of about 0.1%, the coated layer is irradiated with ultraviolet ray of illumination intensity of 400 mW/cm² and a dose of 100 mJ/cm² with an air cooled metal halide lamp of 160 W/cm (manufactured by EYEGRAPHICS CO., LTD.), and a hardened coated layer is wound. The coating amount is adjusted so that the thickness of each light scattering layer reaches 5 μm.

TABLE 1

| | Coating Solution A-1 | Coating Solution A-2 | Coating Solution A-3 | Coating Solution A-4 | Coating Solution A-5 | Coating Solution A-6 | Coating Solution A-7 | Coating Solution A-8 | Coating Solution A-9 | Coating Solution A-10 | Coating Solution A-11 | Coating Solution A-12 | Coating Solution A-13 |
|---|---|---|---|---|---|---|---|---|---|---|---|---|---|
| PET-30 | 14.82 | 14.82 | 14.82 | 14.82 | 14.82 | 14.82 | 18.31 | 10.36 | 0.00 | 10.36 | 10.36 | 10.36 | 19.09 |
| Viscoat V360 | 22.23 | 22.23 | 22.23 | 22.23 | 22.23 | 22.23 | 27.47 | 15.54 | 0.00 | 15.54 | 15.54 | 15.54 | 28.63 |
| DPHA | 0.00 | 0.00 | 0.00 | 0.00 | 0.00 | 0.00 | 0.00 | 0.00 | 1.67 | 0.00 | 0.00 | 0.00 | 0.00 |
| Z7404 | 0.00 | 0.00 | 0.00 | 0.00 | 0.00 | 0.00 | 0.00 | 0.00 | 58.00 | 0.00 | 0.00 | 0.00 | 0.00 |
| Particles (38 wt % MIBK) | 28.95 | 28.95 | 28.95 | 28.95 | 28.95 | 28.95 | 5.26 | 59.21 | 28.95 | 59.21 | 59.21 | 59.21 | 0.00 |
| Irg 127 | 1.15 | 1.15 | 1.15 | 1.15 | 1.15 | 1.15 | 1.42 | 0.80 | 1.15 | 0.80 | 0.80 | 0.80 | 1.48 |
| MIBK | 19.55 | 19.55 | 19.55 | 19.55 | 19.55 | 19.55 | 34.24 | 0.79 | 1.93 | 0.79 | 0.79 | 0.79 | 37.50 |
| MEK | 12.50 | 12.50 | 12.50 | 12.50 | 12.50 | 12.50 | 12.50 | 12.50 | 7.50 | 12.50 | 12.50 | 12.50 | 12.50 |
| SP-13 | 0.06 | 0.06 | 0.06 | 0.06 | 0.06 | 0.06 | 0.06 | 0.06 | 0.06 | 0.06 | 0.06 | 0.06 | 0.06 |
| CAB | 0.75 | 0.75 | 0.75 | 0.75 | 0.75 | 0.75 | 0.75 | 0.75 | 0.75 | 0.75 | 0.75 | 0.75 | 0.75 |
| Kind of particles | Particles 1 | Particles 2 | Particles 3 | Particles 4 | Particles 5 | Particles 6 | Particles 1 | Particles 1 | Particles 7 | Particles 8 | Particles 9 | Particles 10 | None |

In Table 1, the unit is gram.

Mounting on a Display:

The surface film of a 11 inch-organic EL television XEL-1 (manufactured by Sony Corporation) is peeled off, and each of light scattering film samples 101 to 109 is stuck with an adhesive in place of the surface film to manufacture a display.

This organic EL television is an organic EL display using an optically resonating function, and a substrate on the viewing side is a glass substrate having a thickness of 0.7 mm.

Evaluation of Light Scattering Film and Display:

These light scattering films and displays obtained are evaluated for the following items. The results obtained are shown in Table 2 below.

(1) Refractive Index:

The refractive index of the film of each light scattering layer excluding light scattering particles is directly measured with Abbe's refractometer. The refractive index of light scattering particles is measured as follows. Two kinds of solvents arbitrarily selected from methylene iodide, 1,2-dibromopropane and n-hexane different in refractive index are mixed by changing a mixing ratio to obtain solvents different in refractive index, and light transmitting particles are dispersed in each of the solvents in an equivalent amount and turbidity is measured, and the refractive index of the solvents at the time when the turbidity becomes minimum is measured with Abbe's refractometer;

(2) Asymmetry Parameter:

Asymmetry parameter g is defined by the value of the coefficient of scattering anisotropy (the calculated value described in Bohren-Huffman, Absorption and Scattering of Light by Small Particles 3,4) and found by calculation, (3) Scattering Efficiency:

Scattering efficiency n×C is computed from scattering cross section C and number of particles n based on Mic scattering theory.

(4) $I_{30}/I_0$:

Scattered light profile of a light scattering film is measured with a gonio-photometer. A light scattering film is arranged vertically to incident light with an automatic deflection angle photometer Model GP-5 (manufactured by Murakami Color Research Laboratory) and the scattered light profile is measured, and found as the calculated value of $I_{30}/I_0$ with the value in the direction of 0° (direct advance direction) of the forward scattering factor being $I_0$, and the value in the direction of 30° (the direction inclined by 30° from the direct advance direction) of the forward scattering factor being $I_{30}$.

(5) Tint of Viewing Angle:

In white displaying of the display, the direction at a right angle (front) to the display is taken as 0°. The angle is inclined to 80° in the transverse direction, and variation of tint is visually observed in a dark room, and judged by the following criteria A: Variation in the tint with the change of angle is hardly seen,
B: Variation in the tint with the change of angle is seen but not annoyed,
C; Variation in the tint with the change of angle is annoyed.

(6) Frontal Luminance:

In white displaying of the display, luminance is observed at the front of the display in a dark room, and frontal luminance as compared with the time not sticking the light scattering film is judged by the following criteria.

A: Change in luminance by sticking a light scattering film does not jar upon feelings.
B: Change in luminance by sticking a light scattering film jars upon feelings but is not a matter for use.
C: Change in luminance by sticking a light scattering film jars upon feelings and is somewhat problematic.
D: Change in luminance by sticking a light scattering film is great and on a problematic level.

(7) Feeling of Discoloration:

In black displaying of the display, the display is observed at the front and feeling of discoloration is evaluated in a bright room by the following criteria.

A: Discoloration is not perceived.
B: Discoloration is perceived a little but is not a matter for use.
C. Discoloration is perceived and somewhat problematic.
D: Strongly discolored and on a problematic level.

Central Line Average Roughness (Ra):

Central line average roughness (Ra) (μm) is measured with Surfcorder MODEL SE-3F (manufactured by Kosaka Laboratory Ltd.) in conformity with JIS-80601.

Average Reflectance:

The rear face of a film is roughened with sand paper, and then treated with black ink to get rid of rear face reflection. The spectral reflectance of the front face side is measured in the wavelength region of from 380 to 780 nm with a spectrophotometer (manufactured by JASCO Corporation). The result is obtained by the arithmetic mean value of integrated reflectance and mirror reflectance of from 450 to 650 nm.

The maximum value of emission wavelength of the display in the invention is in the range of 350 nm or more and 700 nm or less, and $[(x_{60}-x_0)^2+(y_{60}-y_0)^2]^{1/2}$ is in the range of 0.08 or more and 0.25 or less, taking the color coordinate of emission spectrum in the direction of output angle of 0° on xy chromaticity diagram as $(x_0, y_0)$ and the color coordinate of emission spectrum in the direction of output angle of 60° as $(x_{60}, y_{60})$.

The results of evaluations are shown in Table 2 below. From Table 2, it can be seen that since the organic EL displays in the invention have a light scattering film having specific optical performances according to the invention, as compared with the case of not using a light scattering film, good display performances can be achieved such that variation of tint is little when images on the display are observed from various directions, lowering of the frontal luminance is little, and feeling of discoloration is also little.

In each light scattering film, integrated reflectance is 4.5%, a* value is in the range of from 0 to 0.2, b* value is in the range of from −1.0 to 0, and reflected colors are neutral but mirroring in to the surface is on a level somewhat jarring upon feelings. In all the light scattering films in the invention, central line average roughness is from 0.03 to 0.18 μm.

TABLE 2

| Sample No. | Coating Solution | Refractive Index of Binder (nb) | Particles | Particle Size (μm) | Refractive Index of Particles (np) | np/nb | Content of Particles (wt %) | Film Thickness (μm) | Asymmetry Parameter (g) |
|---|---|---|---|---|---|---|---|---|---|
| 101 | A-1 | 1.52 | Particles 1 | 0.5 | 1.65 | 1.09 | 22 | 5 | 0.88 |
| 102 | A-2 | 1.52 | Particles 2 | 1.5 | 1.65 | 1.09 | 22 | 5 | 0.97 |
| 103 | A-3 | 1.52 | Particles 3 | 0.1 | 1.65 | 1.09 | 22 | 5 | 0.13 |
| 104 | A-4 | 1.52 | Particles 4 | 0.5 | 1.53 | 1.01 | 22 | 5 | 0.89 |
| 105 | A-5 | 1.52 | Particles 5 | 0.3 | 1.65 | 1.09 | 22 | 5 | 0.76 |
| 106 | A-6 | 1.52 | Particles 6 | 1.1 | 1.65 | 1.09 | 22 | 5 | 0.96 |
| 107 | A-7 | 1.52 | Particles 1 | 0.5 | 1.65 | 1.09 | 4 | 5 | 0.88 |
| 108 | A-8 | 1.52 | Particles 1 | 0.5 | 1.65 | 1.09 | 45 | 5 | 0.88 |

TABLE 2-continued

| | | | | | | | | | |
|---|---|---|---|---|---|---|---|---|---|
| 109 | A-9 | 1.62 | Particles 7 | 0.5 | 1.44 | 0.89 | 22 | 5 | 0.90 |
| 110 | A-10 | 1.52 | Particles 8 | 0.5 | 1.50 | 0.99 | 22 | 5 | 0.89 |
| 111 | A-11 | 1.52 | Particles 9 | 0.6 | 1.95 | 1.28 | 22 | 5 | 0.87 |
| 112 | A-12 | 1.52 | Particles 10 | 0.38 | 2.52 | 1.66 | 22 | 5 | 0.68 |
| 113 | A-13 | 1.52 | None | — | — | — | — | 5 | — |

| Sample No. | Scattering Efficiency (e) | $I_{30}/I_0$ | Tint of Viewing Angle | Frontal Luminance | Feeling of Discoloration | Remarks |
|---|---|---|---|---|---|---|
| 101 | 1.15 | 0.63 | A | A | A | Invention |
| 102 | 2.87 | 0.02 | C | A | A | Comparison |
| 103 | 0.08 | 0.98 | A | D | D | Comparison |
| 104 | 0.01 | 0.63 | B | B | B | Comparison |
| 105 | 0.60 | 0.85 | A | B | B | Invention |
| 106 | 2.40 | 0.09 | B | A | A | Invention |
| 107 | 1.15 | 0.63 | B | A | A | Invention |
| 108 | 1.15 | 0.63 | A | B | B | Invention |
| 109 | 1.58 | 0.65 | A | A | A | Invention |
| 110 | 0.02 | 0.64 | C | B | B | Comparison |
| 111 | 10.52 | 0.48 | B | C | C | Invention |
| 112 | 25.09 | 0.72 | A | D | D | Comparison |
| 113 | — | — | C | A | A | Comparison |

Example 2

A low refractive index layer mainly comprising a fluorine polymer and hollow particles having a refractive index of 1.36 is formed in a thickness of 90 nm on the light scattering layer of the light scattering film of the invention in Example 1. The integrated reflectance after forming the low refractive index layer is as low as 2.0% in contrast to the integrated reflectance of 4.5% before forming the low refractive index layer, so that reflection is restrained, and the display after mounting each sample is good in the improvements of viewing angle dependency of tint, frontal luminance, and feeling of discoloration, in addition the enhancement of black in a bright room is bettered. Incidentally, the mirror reflectance after forming the low refractive index layer is from 1.5% to 1.7%.

Example 3

An intermediate refractive index layer mainly comprising DPHA and zirconia fine particles (particle size: about 10 nm) having a refractive index of 1.62, a high refractive index layer having a refractive index of 1.72, and a low refractive index layer mainly comprising a fluorine polymer and hollow particles having a refractive index of 1.36 are formed in this order respectively in thickness of 60 nm, 110 nm and 90 nm on the light scattering layer of the light scattering film of the invention in Example 1. The integrated reflectance after forming three layers is as low as 0.9% in contrast to the integrated reflectance of 4.5% before forming three layers, so that reflection is restrained, and the display after mounting each sample is good in the improvements of viewing angle dependency of tint, frontal luminance, and feeling of discoloration, in addition the enhancement of black in a bright room is further bettered. Incidentally, the mirror reflectance after forming three layers is from 0.5% to 0.9%, and a* value is in the range of from 0 to 3, b* value is in the range of from −4 to 0. Reflected colors are very neutral and display grade at the time of black displaying is excellent.

Example 4

A display is manufactured in the same manner as in Example 1 except for using a glass substrate having a thickness of 0.1 mm as the substrate on the viewing side of the organic EL display in Example 1. The surface and edges of the glass substrate are coated with a polymer obtainable by hydrolytic polycondensation of tetraethoxysilane, γ-acryloxy propyl trimethoxysilane and γ-amino propyl trimethoxysilane. Thereby, viewing angle dependency of tint, frontal luminance, and feeling of discoloration of the organic EL display using the light scattering film in the invention are improved, and the display can be lightened and feeling of a blur of an image can be further restrained.

Example 5

A display is manufactured by directly forming a laminate comprising a light scattering layer, a low refractive index layer, an intermediate refractive index layer, a high refractive index layer, and a low refractive index layer on a water vapor barrier film in the same manner as in Example 3 and using it as a substrate on the viewing side, and evaluated. The water vapor barrier film has a water vapor permeation of 0.005 g/m²·day at 40° C. 90% RH and is a laminate comprising a 40 nm polyethylene naphthalate film having thereon an acrylic organic resin layer formed by a coating system, and a silica thin layer formed by a sputtering system. Thereby, viewing angle dependency of tint, frontal luminance, and feeling of discoloration are improved and, further, the display can be lightened and feeling of a blur of an image can be restrained. In addition, an image having good durability can be manufactured.

Since the organic EL displays in the invention have a light scattering film having specific optical performances according to the invention, as compared with the case of not using a light scattering film, good display performances can be achieved such that variation of tint is little when images on the display are observed from various directions, lowering of the frontal luminance is little, and feeling of discoloration is also little. Moreover, the organic EL displays in the invention have characteristics such as light weight, thin, and little in a blur of letters. Further, the displays in the invention are excellent in manufacturing suitability, selectivity of materials and durability.

By using the technique in the invention, an organic EL display improved in viewing angle dependency can be provided. The invention can also provide a thin type organic EL display restrained in a blur of letters (reduction of image resolution) can be provided. Further, the improvement of frontal contrast can be achieved at the same time. The invention can provide an organic EL display having these effects in high productivity.

The entire disclosure of each and every foreign patent application from which the benefit of foreign priority has been claimed in the present application is incorporated herein by reference, as if fully set forth.

What is claimed is:

1. An organic electroluminescent display comprising:
   a pair of substrates;
   an organic electroluminescent device between the pair of substrates, comprising:
   a pair of electrodes of an anode and a cathode, and
   a light-emitting layer between the pair of electrodes; and
   a light scattering film on a substrate on the viewing side of the pair of substrates, comprising:
   a transparent substrate film, and
   a light scattering layer which contains a light transmitting resin and a light scattering particle having a particle size of from 0.3 μm to 1.2 μm,
   wherein
   a ratio of (np/nb) is from 0.80 to 0.95 or from 1.05 to 1.35, taking a refractive index of the light scattering particle and the light transmitting resin as np and nb, respectively, and
   the light scattering film has asymmetry parameter (g) of from 0.70 to 0.98.

2. The organic electroluminescent display of claim 1, wherein the particle size of the light scattering particles is from 0.4 μm to 1.0 μm.

3. The organic electroluminescent display of claim 1, wherein the light scattering film has a scattering efficiency (e) of from 0.05 to 12.0.

4. The organic electroluminescent display of claim 1, wherein
   a ratio of $(I_{30}/I_0)$ is from 0.08 to 0.99, taking a scattered light intensity of a scattered light profile by a goniophotometer at output angle 0° and 30° as $I_0$ and $I_{30}$, respectively.

5. The organic electroluminescent display of claim 1, wherein
   the light scattering film is an antireflection film comprising a low refractive index layer, directly or via any other layer, on a surface of the light scattering layer, and
   an average value of mirror reflectivity at 5° incidence of the antireflection film in a wavelength region of from 450 to 650 nm is from 0.1% to 2.0%.

6. The organic electroluminescent display of claim 5, wherein
   the tints of regularly reflected light of the antireflection film to 5° incident light of CIE standard light source D65 in a wavelength region of from 380 nm to 780 nm as a* and b* values of CIE1976L*a*b* color space are respectively in a range of $-8 \leq a^* \leq 8$ and $-10 < b^* < 10$.

7. The organic electroluminescent display of claim 1, wherein
   a center line average roughness (Ra) on a surface of the light scattering film is from 0.003 μm to 0.20 μm.

8. The organic electroluminescent display of claim 1, wherein
   the transparent substrate film has a thickness of from 10 μm to 80 μm.

9. The organic electroluminescent display of claim 1, wherein
   the transparent substrate film has a water vapor permeability of 0.01 g/m²·day or less at 40° C. 90% RH.

10. The organic electroluminescent display of claim 1, wherein
    a maximum value of emission wavelength is from 350 nm to 700 nm, and
    $[(x_{60}-x_0)^2+(y_{60}-y_0)^2]^{1/2}$ is from 0.05 to 0.3, taking a color coordinate of emission spectrum in a direction of output angle of 0° and 60° on xy chromaticity diagram as $(x_0, y_0)$ and $(x_{60}, y_{60})$, respectively.

11. The organic electroluminescent display of claim 1, wherein
    a light reflected between the surfaces of both electrodes is optically resonated.

12. The organic electroluminescent display of claim 1, wherein
    the substrate on the viewing side has a thickness of from 0.01 mm to 0.70 mm.

13. The organic electroluminescent display of claim 1, wherein
    the substrate on the viewing side has a thickness of from 0.03 mm to 0.30 mm.

14. The organic electroluminescent display of claim 1, wherein
    at least one of the surface and the edge of the substrate on the viewing side is coated with a polymer.

15. The organic electroluminescent display of claim 1, wherein
    the substrate on the viewing side is a gas barrier film.

16. An organic electroluminescent display comprising:
    a pair of substrates; and
    an organic electroluminescent device between the pair of substrates, comprising:
    a pair of electrodes of an anode and a cathode, and
    a light-emitting layer between the pair of electrodes,
    wherein
    at least a substrate on the viewing side of the pair of substrates is a light scattering film comprising:
    a gas barrier film having a water vapor permeability of 0.01 g/m²·day or less at 40° C. 90% RH, and
    a light scattering layer which contains a light transmitting resin and a light scattering particle having a particle size of from 0.3 μm to 1.2 μm; and
    a ratio of (np/nb) is from 0.80 to 0.95 or from 1.05 to 1.35, taking a refractive index of the light scattering particle and the light transmitting resin as np and nb, respectively.

* * * * *